United States Patent
Zbiciak et al.

(10) Patent No.: US 12,235,773 B2
(45) Date of Patent: Feb. 25, 2025

(54) TWO ADDRESS TRANSLATIONS FROM A SINGLE TABLE LOOK-ASIDE BUFFER READ

(71) Applicant: TEXAS INSTRUMENTS INCORPORATED, Dallas, TX (US)

(72) Inventors: Joseph Zbiciak, San Jose, CA (US); Son H. Tran, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/158,095

(22) Filed: Jan. 26, 2021

(65) Prior Publication Data

US 2021/0149820 A1    May 20, 2021

Related U.S. Application Data

(63) Continuation of application No. 16/251,795, filed on Jan. 18, 2019, now Pat. No. 10,901,913, which is a
(Continued)

(51) Int. Cl.
*G06F 12/1045* (2016.01)
*G06F 7/24* (2006.01)
(Continued)

(52) U.S. Cl.
CPC ............ *G06F 12/1045* (2013.01); *G06F 7/24* (2013.01); *G06F 7/487* (2013.01); *G06F 7/4876* (2013.01);
(Continued)

(58) Field of Classification Search
CPC ............ G06F 12/1045; G06F 12/0862; G06F 12/0875; G06F 12/0897; G06F 12/1009; G06F 9/30014; G06F 9/30036; G06F 9/30065; G06F 9/30098; G06F 9/30112; G06F 9/30145; G06F 9/3016; G06F 9/32; G06F 9/345; G06F 9/3802; G06F 9/383;
(Continued)

(56) References Cited

U.S. PATENT DOCUMENTS

| | | |
|---|---|---|
| 3,970,999 A | 7/1976 | Elward |
| 4,737,909 A | 4/1988 | Harada |

(Continued)

*Primary Examiner* — Ryan Bertram
(74) *Attorney, Agent, or Firm* — Brian D. Graham; Frank D. Cimino

(57) ABSTRACT

A streaming engine employed in a digital data processor specifies a fixed read only data stream. An address generator produces virtual addresses of data elements. An address translation unit converts these virtual addresses to physical addresses by comparing the most significant bits of a next address N with the virtual address bits of each entry in an address translation table. Upon a match, the translated address is the physical address bits of the matching entry and the least significant bits of address N. The address translation unit can generate two translated addresses. If the most significant bits of address N+1 match those of address N, the same physical address bits are used for translation of address N+1. The sequential nature of the data stream increases the probability that consecutive addresses match the same address translation entry and can use this technique.

19 Claims, 20 Drawing Sheets

Related U.S. Application Data continuation of application No. 15/384,625, filed on Dec. 20, 2016, now abandoned, which is a continuation-in-part of application No. 14/331,986, filed on Jul. 15, 2014, now Pat. No. 9,606,803.

(60) Provisional application No. 61/846,148, filed on Jul. 15, 2013.

(51) Int. Cl.

| | | |
|---|---|---|
| *G06F 7/487* | (2006.01) | |
| *G06F 7/499* | (2006.01) | |
| *G06F 7/53* | (2006.01) | |
| *G06F 7/57* | (2006.01) | |
| *G06F 9/30* | (2018.01) | |
| *G06F 9/32* | (2018.01) | |
| *G06F 9/345* | (2018.01) | |
| *G06F 9/38* | (2018.01) | |
| *G06F 9/48* | (2006.01) | |
| *G06F 11/00* | (2006.01) | |
| *G06F 11/10* | (2006.01) | |
| *G06F 12/0862* | (2016.01) | |
| *G06F 12/0875* | (2016.01) | |
| *G06F 12/0897* | (2016.01) | |
| *G06F 12/1009* | (2016.01) | |
| *G06F 17/16* | (2006.01) | |
| *H03H 17/06* | (2006.01) | |
| *G06F 15/78* | (2006.01) | |

(52) U.S. Cl.
CPC ............ *G06F 7/49915* (2013.01); *G06F 7/53* (2013.01); *G06F 7/57* (2013.01); *G06F 9/3001* (2013.01); *G06F 9/30014* (2013.01); *G06F 9/30018* (2013.01); *G06F 9/30021* (2013.01); *G06F 9/30032* (2013.01); *G06F 9/30036* (2013.01); *G06F 9/30065* (2013.01); *G06F 9/30072* (2013.01); *G06F 9/30098* (2013.01); *G06F 9/30112* (2013.01); *G06F 9/30145* (2013.01); *G06F 9/30149* (2013.01); *G06F 9/3016* (2013.01); *G06F 9/32* (2013.01); *G06F 9/345* (2013.01); *G06F 9/3802* (2013.01); *G06F 9/3818* (2013.01); *G06F 9/383* (2013.01); *G06F 9/3836* (2013.01); *G06F 9/3851* (2013.01); *G06F 9/3856* (2023.08); *G06F 9/3867* (2013.01); *G06F 9/3887* (2013.01); *G06F 9/48* (2013.01); *G06F 11/00* (2013.01); *G06F 11/1048* (2013.01); *G06F 12/0862* (2013.01); *G06F 12/0875* (2013.01); *G06F 12/0897* (2013.01); *G06F 12/1009* (2013.01); *G06F 17/16* (2013.01); *H03H 17/0664* (2013.01); *G06F 9/325* (2013.01); *G06F 9/381* (2013.01); *G06F 9/3822* (2013.01); *G06F 11/10* (2013.01); *G06F 15/7807* (2013.01); *G06F 15/781* (2013.01); *G06F 2212/452* (2013.01); *G06F 2212/60* (2013.01); *G06F 2212/602* (2013.01); *G06F 2212/68* (2013.01)

(58) Field of Classification Search
CPC .... G06F 9/3867; G06F 9/30018; G06F 9/325; G06F 9/381; G06F 9/3822; G06F 11/00; G06F 11/1048; G06F 11/10; G06F 2212/452; G06F 2212/60; G06F 2212/602; G06F 2212/68
See application file for complete search history.

(56) References Cited

U.S. PATENT DOCUMENTS

| | | | | |
|---|---|---|---|---|
| 5,430,856 | A | * | 7/1995 | Kinoshita ........... G06F 12/1027 711/209 |
| 5,502,829 | A | * | 3/1996 | Sachs .................. G06F 12/1027 712/E9.041 |
| 5,835,963 | A | | 11/1998 | Yoshioka et al. |
| 6,026,467 | A | | 2/2000 | Petty |
| 7,944,452 | B1 | * | 5/2011 | Wietkemper ....... G06F 12/0223 345/568 |
| 8,478,959 | B1 | * | 7/2013 | Wyatt ................. G06F 12/1475 711/163 |
| 9,430,240 | B1 | | 8/2016 | Atta et al. |
| 2004/0078590 | A1 | | 4/2004 | Ellison et al. |
| 2005/0177699 | A1 | * | 8/2005 | Oberlaender ........... G06F 12/04 711/201 |
| 2007/0016753 | A1 | | 1/2007 | Winter |
| 2007/0106874 | A1 | | 5/2007 | Pan et al. |
| 2009/0172343 | A1 | | 7/2009 | Savagaonkar |
| 2011/0055458 | A1 | | 3/2011 | Kuehne |
| 2012/0215965 | A1 | | 8/2012 | Inada et al. |
| 2012/0226888 | A1 | | 9/2012 | Rychlik et al. |
| 2013/0311711 | A1 | | 11/2013 | Yang et al. |
| 2013/0318322 | A1 | | 11/2013 | Shetty et al. |
| 2016/0188337 | A1 | | 6/2016 | Lee et al. |

\* cited by examiner

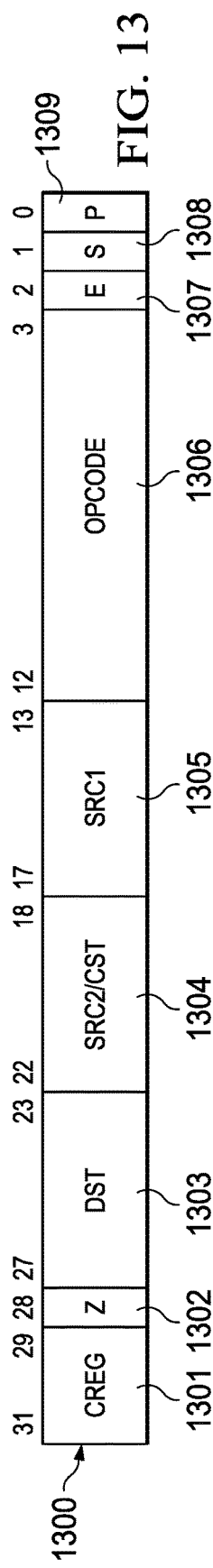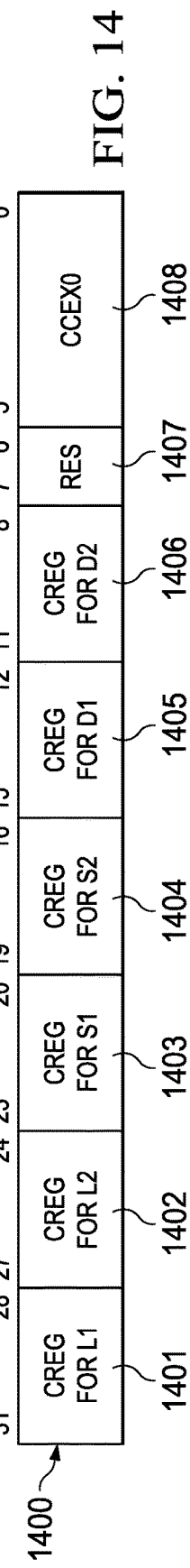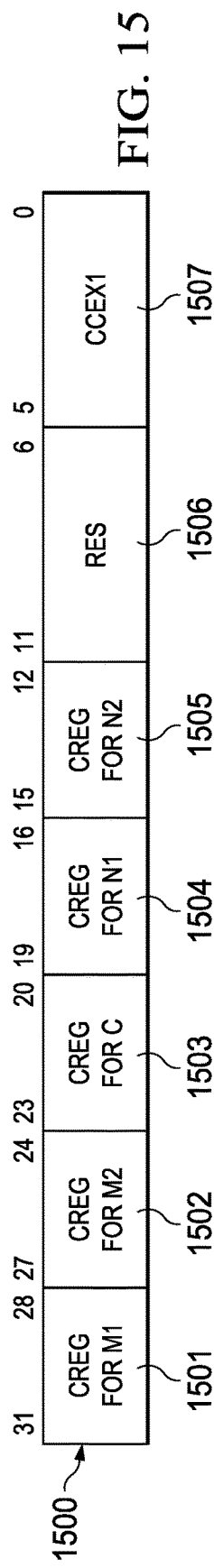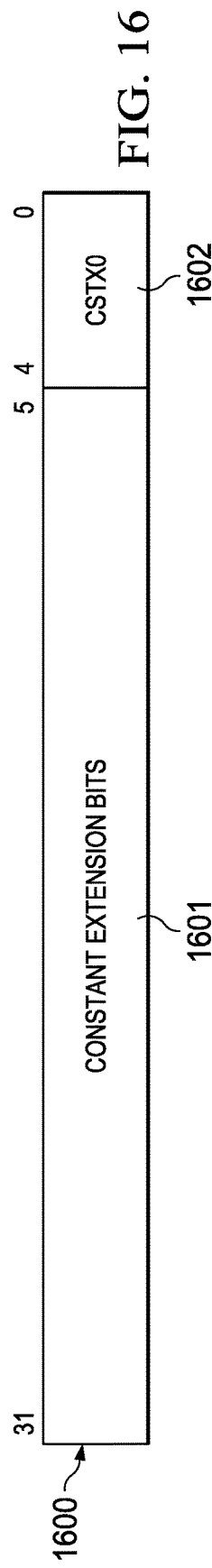

TWO ADDRESS TRANSLATIONS FROM A SINGLE TABLE LOOK-ASIDE BUFFER READ

CROSS-REFERENCE TO RELATED APPLICATIONS

This application is a continuation of U.S. patent application Ser. No. 16/251,795, filed Jan. 18, 2019, which is a continuation of U.S. patent application Ser. No. 15/384,625, filed Dec. 20, 2016, now abandoned, which is a continuation-in-part application of U.S. patent application Ser. No. 14/331,986, filed Jul. 15, 2014, now U.S. Pat. No. 9,606,803, which claims priority from U.S. Provisional Patent Application Ser. No. 61/846,148, filed Jul. 15, 2013, each of which is incorporated by reference herein in its entirety.

TECHNICAL FIELD

The technical field of this invention is digital data processing and more specifically control of streaming engine used for operand fetching.

BACKGROUND

Modern digital signal processors (DSP) faces multiple challenges. Workloads continue to increase, requiring increasing bandwidth. Systems on a chip (SOC) continue to grow in size and complexity. Memory system latency severely impacts certain classes of algorithms. As transistors get smaller, memories and registers become less reliable. As software stacks get larger, the number of potential interactions and errors becomes larger.

Memory bandwidth and scheduling are a problem for digital signal processors operating on real-time data. Digital signal processors operating on real-time data typically receive an input data stream, perform a filter function on the data stream (such as encoding or decoding) and output a transformed data stream. The system is called real-time because the application fails if the transformed data stream is not available for output when scheduled. Typical video encoding requires a predictable but non-sequential input data pattern. Often the corresponding memory accesses are difficult to achieve within available address generation and memory access resources. A typical application requires memory access to load data registers in a data register file and then supply to functional units which preform the data processing.

SUMMARY

This invention is a streaming engine employed in a digital signal processor. A fixed data stream sequence is specified by storing corresponding parameters in a control register. The data stream may include plural nested loops. Once started the data stream is read only and cannot be written. This generally corresponds to the needs of a real-time filtering operation.

The streaming engine includes an address generator which produces address of data elements and a steam head register which stores data elements next to be supplied to functional units for use as operands. In the preferred embodiment the data streams are defined in virtual memory and the data elements are stored in physical memory.

The stream engine includes an address translation unit for virtual to physical address translation. The most significant bits of a next sequential address N are compared with the virtual address bits of each entry in an address translation table. A comparator determines whether the most significant bits match. Upon detection of a match, the translated physical address if formed from the physical address bits of the matching entry as most significant bits and the least significant of the original address N.

The address translation unit can generate two translated addresses. If the most significant bits of a next address N+1 match those of address N, the same physical address bits are used for translation of address N+1. The sequential nature of the data stream increases the probability that consecutive addresses match the same address translation entry and can use this technique.

BRIEF DESCRIPTION OF THE DRAWINGS

These and other aspects of this invention are illustrated in the drawings, in which:

FIG. 13 illustrates an example of the instruction coding of instructions used by this invention;

FIG. 14 illustrates a bit coding of a condition code extension slot 0;

FIG. 15 illustrates a bit coding of a condition code extension slot 1;

FIG. 16 illustrates a bit coding of a constant extension slot 0;

DETAILED DESCRIPTION OF PREFERRED EMBODIMENTS

Figure 1:
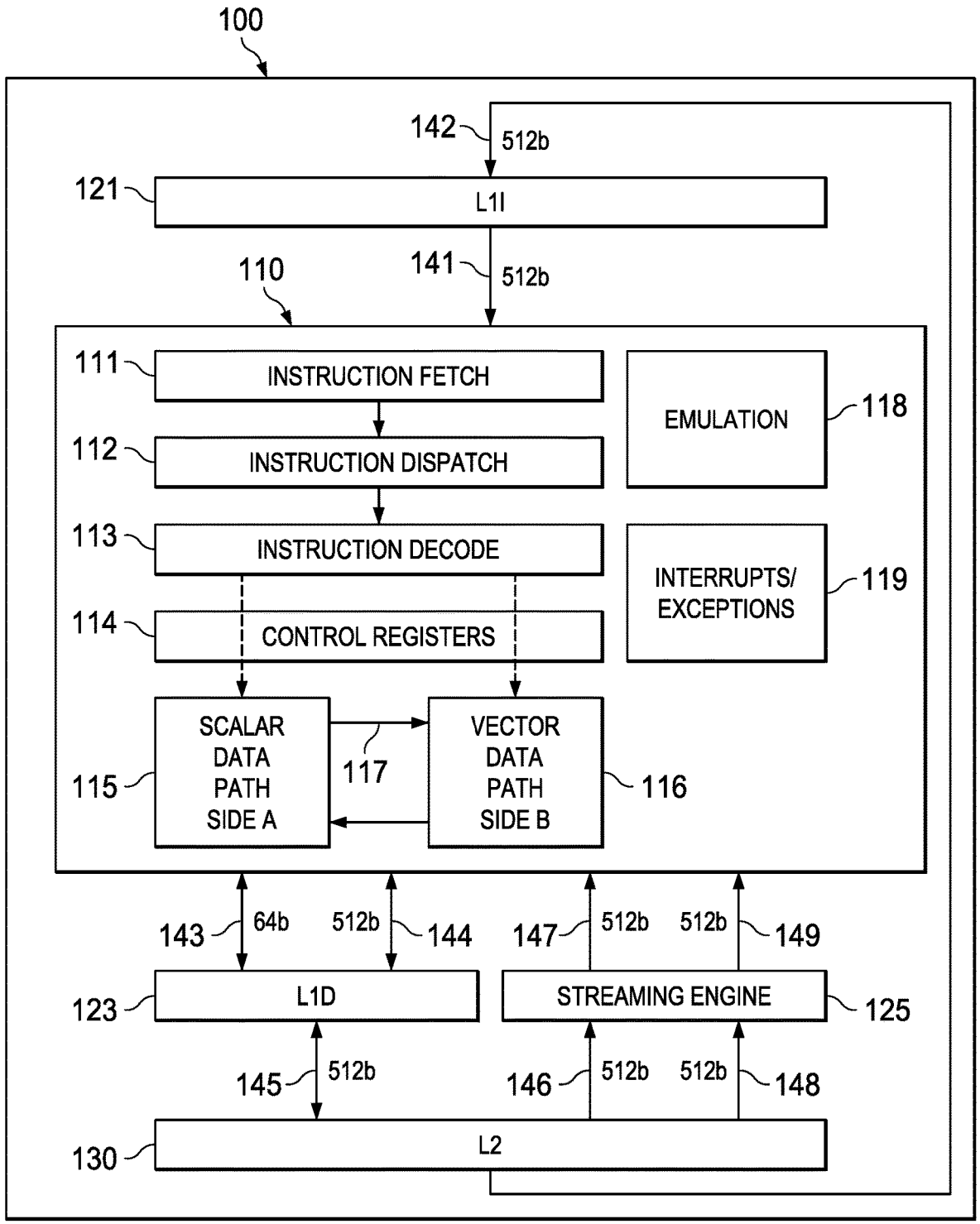
FIG. 1 illustrates a dual scalar/vector datapath processor according to one embodiment of this invention.

FIG. 1 illustrates a dual scalar/vector datapath processor according to a preferred embodiment of this invention. Processor 100 includes separate level one instruction cache (L1I) 121 and level one data cache (L1D) 123. Processor 100 includes a level two combined instruction/data cache (L2) 130 that holds both instructions and data. FIG. 1 illustrates connection between level one instruction cache 121 and level two combined instruction/data cache 130 (bus 142). FIG. 1 illustrates connection between level one data cache 123 and level two combined instruction/data cache 130 (bus 145). In the preferred embodiment of processor 100 level two combined instruction/data cache 130 stores both instructions to back up level one instruction cache 121 and data to back up level one data cache 123. In the preferred embodiment level two combined instruction/data cache 130 is further connected to higher level cache and/or main memory in a manner not illustrated in FIG. 1. In the preferred embodiment central processing unit core 110, level one instruction cache 121, level one data cache 123 and level two combined instruction/data cache 130 are formed on a single integrated circuit. This signal integrated circuit optionally includes other circuits.

Central processing unit core 110 fetches instructions from level one instruction cache 121 as controlled by instruction fetch unit 111. Instruction fetch unit 111 determines the next instructions to be executed and recalls a fetch packet sized set of such instructions. The nature and size of fetch packets are further detailed below. As known in the art, instructions are directly fetched from level one instruction cache 121 upon a cache hit (if these instructions are stored in level one instruction cache 121). Upon a cache miss (the specified instruction fetch packet is not stored in level one instruction cache 121), these instructions are sought in level two combined cache 130. In the preferred embodiment the size of a cache line in level one instruction cache 121 equals the size of a fetch packet. The memory locations of these instructions are either a hit in level two combined cache 130 or a miss. A hit is serviced from level two combined cache 130. A miss is serviced from a higher level of cache (not illustrated) or from main memory (not illustrated). As is known in the art, the requested instruction may be simultaneously supplied to both level one instruction cache 121 and central processing unit core 110 to speed use.

In the preferred embodiment of this invention, central processing unit core 110 includes plural functional units to perform instruction specified data processing tasks. Instruction dispatch unit 112 determines the target functional unit of each fetched instruction. In the preferred embodiment central processing unit 110 operates as a very long instruction word (VLIW) processor capable of operating on plural instructions in corresponding functional units simultaneously. Preferably a complier organizes instructions in execute packets that are executed together. Instruction dispatch unit 112 directs each instruction to its target functional unit. The functional unit assigned to an instruction is completely specified by the instruction produced by a compiler. The hardware of central processing unit core 110 has no part in this functional unit assignment. In the preferred embodiment instruction dispatch unit 112 may operate on plural instructions in parallel. The number of such parallel instructions is set by the size of the execute packet. This will be further detailed below.

One part of the dispatch task of instruction dispatch unit 112 is determining whether the instruction is to execute on a functional unit in scalar datapath side A 115 or vector datapath side B 116. An instruction bit within each instruction called the s bit determines which datapath the instruction controls. This will be further detailed below.

Instruction decode unit 113 decodes each instruction in a current execute packet. Decoding includes identification of the functional unit performing the instruction, identification of registers used to supply data for the corresponding data processing operation from among possible register files and identification of the register destination of the results of the corresponding data processing operation. As further explained below, instructions may include a constant field in place of one register number operand field. The result of this decoding is signals for control of the target functional unit to perform the data processing operation specified by the corresponding instruction on the specified data.

Central processing unit core 110 includes control registers 114. Control registers 114 store information for control of the functional units in scalar datapath side A 115 and vector datapath side B 116 in a manner not relevant to this invention. This information could be mode information or the like.

The decoded instructions from instruction decode 113 and information stored in control registers 114 are supplied to scalar datapath side A 115 and vector datapath side B 116. As a result functional units within scalar datapath side A 115 and vector datapath side B 116 perform instruction specified data processing operations upon instruction specified data and store the results in an instruction specified data register or registers. Each of scalar datapath side A 115 and vector datapath side B 116 includes plural functional units that preferably operate in parallel. These will be further detailed below in conjunction with FIG. 2. There is a datapath 117 between scalar datapath side A 115 and vector datapath side B 116 permitting data exchange.

Central processing unit core 110 includes further non-instruction based modules. Emulation unit 118 permits determination of the machine state of central processing unit core 110 in response to instructions. This capability will typically be employed for algorithmic development. Interrupts/exceptions unit 119 enable central processing unit core 110 to be responsive to external, asynchronous events (interrupts) and to respond to attempts to perform improper operations (exceptions).

Central processing unit core 110 includes streaming engine 125. Streaming engine 125 supplies two data streams from predetermined addresses typically cached in level two combined cache 130 to register files of vector datapath side B. This provides controlled data movement from memory (as cached in level two combined cache 130) directly to functional unit operand inputs. This is further detailed below.

FIG. 1 illustrates exemplary data widths of busses between various parts. Level one instruction cache 121 supplies instructions to instruction fetch unit 111 via bus 141. Bus 141 is preferably a 512-bit bus. Bus 141 is unidirectional from level one instruction cache 121 to central processing unit core 110. Level two combined cache 130 supplies instructions to level one instruction cache 121 via bus 142. Bus 142 is preferably a 512-bit bus. Bus 142 is unidirectional from level two combined cache 130 to level one instruction cache 121.

Level one data cache 123 exchanges data with register files in scalar datapath side A 115 via bus 143. Bus 143 is preferably a 64-bit bus. Level one data cache 123 exchanges data with register files in vector datapath side B 116 via bus 144. Bus 144 is preferably a 512-bit bus. Busses 143 and 144 are illustrated as bidirectional supporting both central processing unit core 110 data reads and data writes. Level one data cache 123 exchanges data with level two combined cache 130 via bus 145. Bus 145 is preferably a 512-bit bus. Bus 145 is illustrated as bidirectional supporting cache service for both central processing unit core 110 data reads and data writes.

Level two combined cache 130 supplies data of a first data stream to streaming engine 125 via bus 146. Bus 146 is preferably a 512-bit bus. Streaming engine 125 supplies data of this first data stream to functional units of vector datapath side B 116 via bus 147. Bus 147 is preferably a 512-bit bus. Level two combined cache 130 supplies data of a second data stream to streaming engine 125 via bus 148. Bus 148 is preferably a 512-bit bus. Streaming engine 125 supplies data of this second data stream to functional units of vector datapath side B 116 via bus 149. Bus 149 is preferably a 512-bit bus. Busses 146, 147, 148 and 149 are illustrated as unidirectional from level two combined cache 130 to streaming engine 125 and to vector datapath side B 116 in accordance with the preferred embodiment of this invention.

In the preferred embodiment of this invention, both level one data cache 123 and level two combined cache 130 may be configured as selected amounts of cache or directly addressable memory in accordance with U.S. Pat. No. 6,606,686 entitled UNIFIED MEMORY SYSTEM ARCHITECTURE INCLUDING CACHE AND DIRECTLY ADDRESSABLE STATIC RANDOM ACCESS MEMORY.

Figure 2:
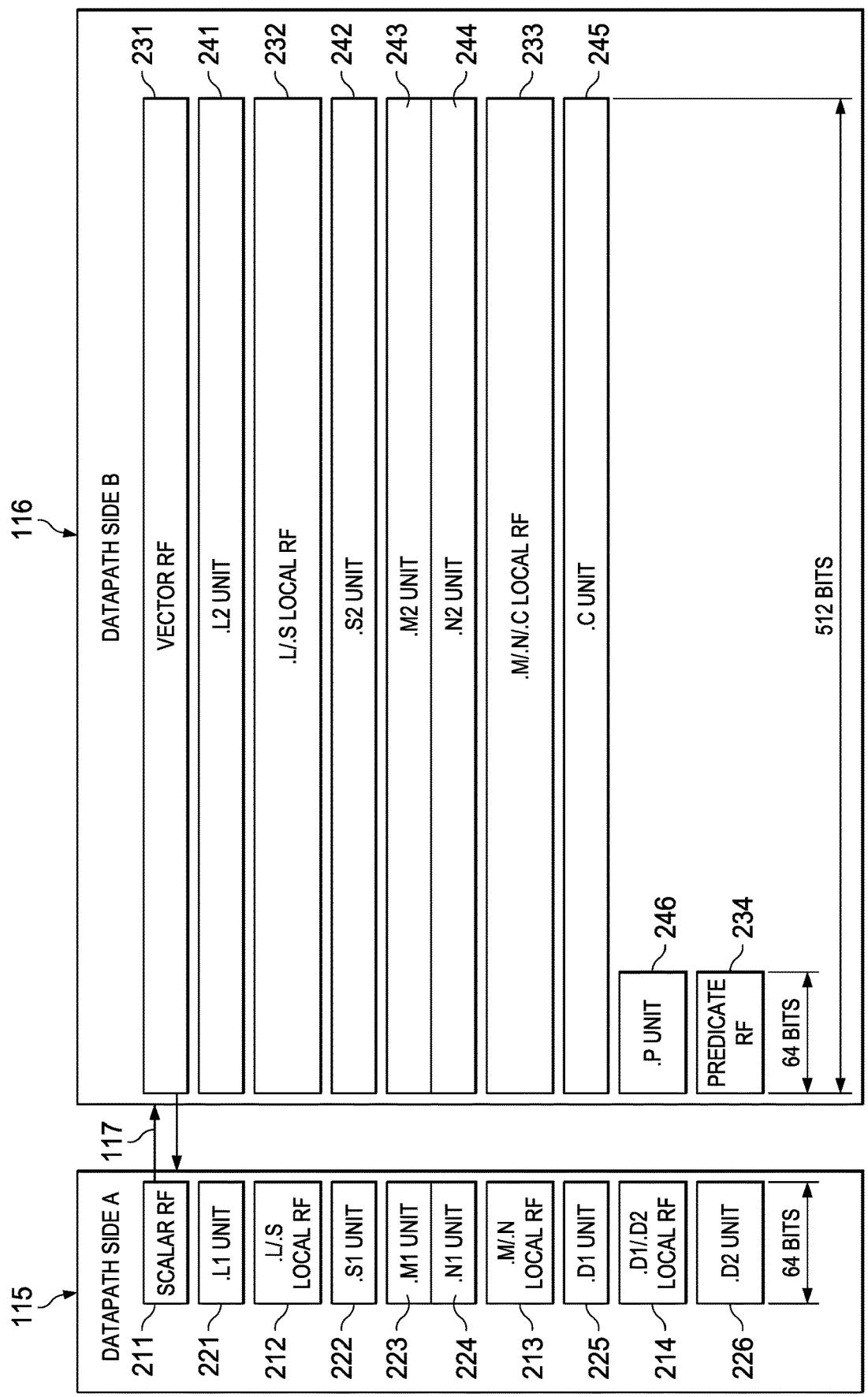
FIG. 2 illustrates the registers and functional units in the dual scalar/vector datapath processor illustrated in FIG. 1.

FIG. 2 illustrates further details of functional units and register files within scalar datapath side A 115 and vector datapath side B 116. Scalar datapath side A 115 includes global scalar register file 211, L1/S1 local register file 212, M1/N1 local register file 213 and D1/D2 local register file 214. Scalar datapath side A 115 includes L1 unit 221, S1 unit 222, M1 unit 223, N1 unit 224, D1 unit 225 and D2 unit 237. Vector datapath side B 116 includes global vector register file 231, L2/S2 local register file 232, M2/N2/C local register file 233 and predicate register file 234. Vector datapath side B 116 includes L2 unit 241, S2 unit 242, M2 unit 243, N2 unit 244, C unit 245 and P unit 246. There are limitations upon which functional units may read from or write to which register files. These will be detailed below.

Scalar datapath side A 115 includes L1 unit 221. L1 unit 221 generally accepts two 64-bit operands and produces one 64-bit result. The two operands are each recalled from an instruction specified register in either global scalar register file 211 or L1/S1 local register file 212. L1 unit 221 preferably performs the following instruction selected operations: 64-bit add/subtract operations; 32-bit min/max operations; 8-bit Single Instruction Multiple Data (SIMD) instructions such as sum of absolute value, minimum and maximum determinations; circular min/max operations; and various move operations between register files. The result may be written into an instruction specified register of global scalar register file 211, L1/S1 local register file 212, M1/N1 local register file 213 or D1/D2 local register file 214.

Scalar datapath side A 115 includes S1 unit 222. S1 unit 222 generally accepts two 64-bit operands and produces one 64-bit result. The two operands are each recalled from an instruction specified register in either global scalar register file 211 or L1/S1 local register file 212. S1 unit 222 preferably performs the same type operations as L1 unit 221. There optionally may be slight variations between the data processing operations supported by L1 unit 221 and S1 unit 222. The result may be written into an instruction specified register of global scalar register file 211, L1/S1 local register file 212, M1/N1 local register file 213 or D1/D2 local register file 214.

Scalar datapath side A 115 includes M1 unit 223. M1 unit 223 generally accepts two 64-bit operands and produces one 64-bit result. The two operands are each recalled from an instruction specified register in either global scalar register file 211 or M/N1 local register file 213. M1 unit 223 preferably performs the following instruction selected operations: 8-bit multiply operations; complex dot product operations; 32-bit count operations; complex conjugate multiply operations; and bit-wise Logical Operations, moves, adds and subtracts. The result may be written into an instruction specified register of global scalar register file 211, L1/S1 local register file 212, M1/N1 local register file 213 or D1/D2 local register file 214.

Scalar datapath side A 115 includes N1 unit 224. N1 unit 224 generally accepts two 64-bit operands and produces one 64-bit result. The two operands are each recalled from an instruction specified register in either global scalar register file 211 or M/N1 local register file 213. N1 unit 224 preferably performs the same type operations as M1 unit 223. There may be certain double operations (called dual issued instructions) that employ both the M1 unit 223 and the N1 unit 224 together. The result may be written into an instruction specified register of global scalar register file 211, L1/S1 local register file 212, M1/N1 local register file 213 or D1/D2 local register file 214.

Scalar datapath side A 115 includes D1 unit 225 and D2 unit 237. D1 unit 225 and D2 unit 237 generally each accept two 64-bit operands and each produce one 64-bit result. D1 unit 225 and D2 unit 237 generally perform address calculations and corresponding load and store operations. D1 unit 225 is used for scalar loads and stores of 64 bits. D2 unit 237 is used for vector loads and stores of 512 bits. D1 unit 225 and D2 unit 237 preferably also perform: swapping, pack and unpack on the load and store data; 64-bit SIMD arithmetic operations; and 64-bit bit-wise logical operations. D1/D2 local register file 214 will generally store base and offset addresses used in address calculations for the corresponding loads and stores. The two operands are each recalled from an instruction specified register in either global scalar register file 211 or D1/D2 local register file 214. The calculated result may be written into an instruction specified register of global scalar register file 211, L1/S1 local register file 212, M1/N1 local register file 213 or D1/D2 local register file 214.

Vector datapath side B 116 includes L2 unit 241. L2 unit 221 generally accepts two 512-bit operands and produces one 512-bit result. The two operands are each recalled from an instruction specified register in either global vector register file 231, L2/S2 local register file 232 or predicate register file 234. L2 unit 241 preferably performs instruction similar to L1 unit 221 except on wider 512-bit data. The result may be written into an instruction specified register of global vector register file 231, L2/S2 local register file 232, M2/N2/C local register file 233 or predicate register file 234.

Vector datapath side B 116 includes S2 unit 242. S2 unit 242 generally accepts two 512-bit operands and produces one 512-bit result. The two operands are each recalled from an instruction specified register in either global vector register file 231, L2/S2 local register file 232 or predicate register file 234. S2 unit 242 preferably performs instructions similar to S1 unit 222 except on wider 512-bit data. The result may be written into an instruction specified register of global vector register file 231, L2/S2 local register file 232, M2/N2/C local register file 233 or predicate register file 234. There may be certain double operations (called dual issued instructions) that employ both L2 unit 241 and the S2 unit 242 together. The result may be written into an instruction specified register of global vector register file 231, L2/S2 local register file 232 or M2/N2/C local register file 233.

Vector datapath side B 116 includes M2 unit 243. M2 unit 243 generally accepts two 512-bit operands and produces one 512-bit result. The two operands are each recalled from an instruction specified register in either global vector register file 231 or M2/N2/C local register file 233. M2 unit 243 preferably performs instructions similar to M1 unit 223 except on wider 512-bit data. The result may be written into an instruction specified register of global vector register file 231, L2/S2 local register file 232 or M2/N2/C local register file 233.

Vector datapath side B 116 includes N2 unit 244. N2 unit 244 generally accepts two 512-bit operands and produces one 512-bit result. The two operands are each recalled from an instruction specified register in either global vector register file 231 or M2/N2/C local register file 233. N2 unit 244 preferably performs the same type operations as M2 unit 243. There may be certain double operations (called dual issued instructions) that employ both M2 unit 243 and the N2 unit 244 together. The result may be written into an instruction specified register of global vector register file 231, L2/S2 local register file 232 or M2/N2/C local register file 233.

Vector datapath side B 116 includes C unit 245. C unit 245 generally accepts two 512-bit operands and produces one 512-bit result. The two operands are each recalled from an instruction specified register in either global vector register file 231 or M2/N2/C local register file 233. C unit 245 preferably performs: "Rake" and "Search" instructions; up to 512 2-bit PN*8-bit multiplies I/Q complex multiplies per clock cycle; 8-bit and 16-bit Sum-of-Absolute-Difference (SAD) calculations, up to 512 SADs per clock cycle; horizontal add and horizontal min/max instructions; and vector permutes instructions. C unit 245 includes also contains 4 vector control registers (CUCR0 to CUCR3) used to control certain operations of C unit 245 instructions. Control registers CUCR0 to CUCR3 are used as operands in certain C unit 245 operations. Control registers CUCR0 to CUCR3 are preferably used: in control of a general permutation instruction (VPERM); and as masks for SIMD multiple DOT product operations (DOTPM) and SIMD multiple Sum-of-Absolute-Difference (SAD) operations. Control register CUCR0 is preferably used to store the polynomials for Galois Field Multiply operations (GFMPY). Control register CUCR1 is preferably used to store the Galois field polynomial generator function.

Vector datapath side B 116 includes P unit 246. P unit 246 performs basic logic operations on registers of local predicate register file 234. P unit 246 has direct access to read from and write to predication register file 234. These operations include AND, ANDN, OR, XOR, NOR, BITR, NEG, SET, BITCNT, RMBD, BIT Decimate and Expand. A commonly expected use of P unit 246 includes manipulation of the SIMD vector comparison results for use in control of a further SIMD vector operation.

Figure 3:
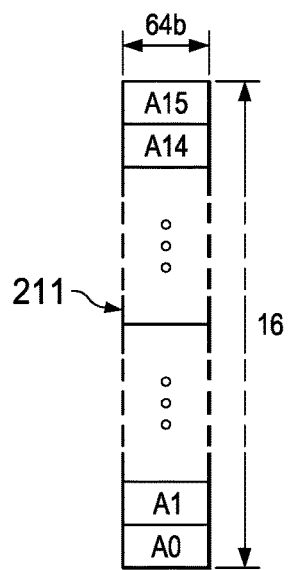
FIG. 3 illustrates a global scalar register file.

FIG. 3 illustrates global scalar register file 211. There are 16 independent 64-bit wide scalar registers designated A0 to A15. Each register of global scalar register file 211 can be read from or written to as 64-bits of scalar data. All scalar datapath side A 115 functional units (L1 unit 221, S1 unit 222, M1 unit 223, N1 unit 224, D1 unit 225 and D2 unit 237) can read or write to global scalar register file 211. Global scalar register file 211 may be read as 32-bits or as 64-bits and may only be written to as 64-bits. The instruction executing determines the read data size. Vector datapath side B 116 functional units (L2 unit 241, S2 unit 242, M2 unit 243, N2 unit 244, C unit 245 and P unit 246) can read from global scalar register file 211 via crosspath 117 under restrictions that will be detailed below.

Figure 4:
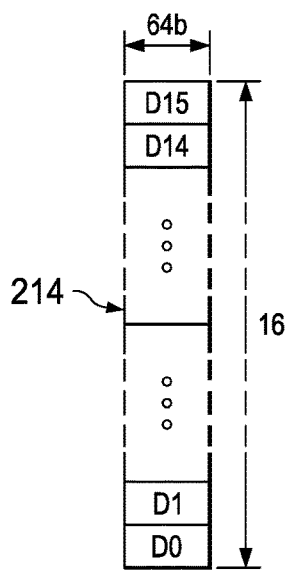
FIG. 4 illustrates a local scalar register file shared by arithmetic functional units.

FIG. 4 illustrates D1/D2 local register file 214. There are 16 independent 64-bit wide scalar registers designated D0 to D16. Each register of D1/D2 local register file 214 can be read from or written to as 64-bits of scalar data. All scalar datapath side A 115 functional units (L1 unit 221, S1 unit 222, M1 unit 223, N1 unit 224, D1 unit 225 and D2 unit 237) can write to global scalar register file 211. Only D1 unit 225 and D2 unit 237 can read from D1/D2 local scalar register file 214. It is expected that data stored in D1/D2 local scalar register file 214 will include base addresses and offset addresses used in address calculation.

Figure 5:
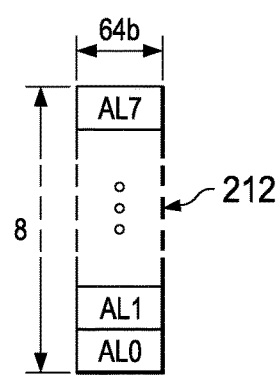
FIG. 5 illustrates a local scalar register file shared by multiply functional units.

FIG. 5 illustrates L1/S1 local register file 212. The embodiment illustrated in FIG. 5 has 8 independent 64-bit wide scalar registers designated AL0 to AL7. The preferred instruction coding (see FIG. 13) permits L1/S1 local register file 212 to include up to 16 registers. The embodiment of FIG. 5 implements only 8 registers to reduce circuit size and complexity. Each register of L1/S1 local register file 212 can be read from or written to as 64-bits of scalar data. All scalar datapath side A 115 functional units (L1 unit 221, S1 unit 222, M1 unit 223, N1 unit 224, D1 unit 225 and D2 unit 237) can write to L1/S1 local scalar register file 212. Only L1 unit 221 and S1 unit 222 can read from L1/S1 local scalar register file 212.

Figure 6:
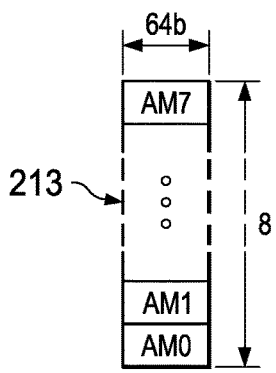
FIG. 6 illustrates a local scalar register file shared by load/store units.

FIG. 6 illustrates M/N local register file 213. The embodiment illustrated in FIG. 6 has 8 independent 64-bit wide scalar registers designated AM0 to AM7. The preferred instruction coding (see FIG. 13) permits M1/N1 local register file 213 to include up to 16 registers. The embodiment of FIG. 6 implements only 8 registers to reduce circuit size and complexity. Each register of M1/N1 local register file 213 can be read from or written to as 64-bits of scalar data. All scalar datapath side A 115 functional units (L1 unit 221, S1 unit 222, M1 unit 223, N1 unit 224, D1 unit 225 and D2 unit 237) can write to M/N1 local scalar register file 213. Only M1 unit 223 and N1 unit 224 can read from M1/N1 local scalar register file 213.

Figure 7:
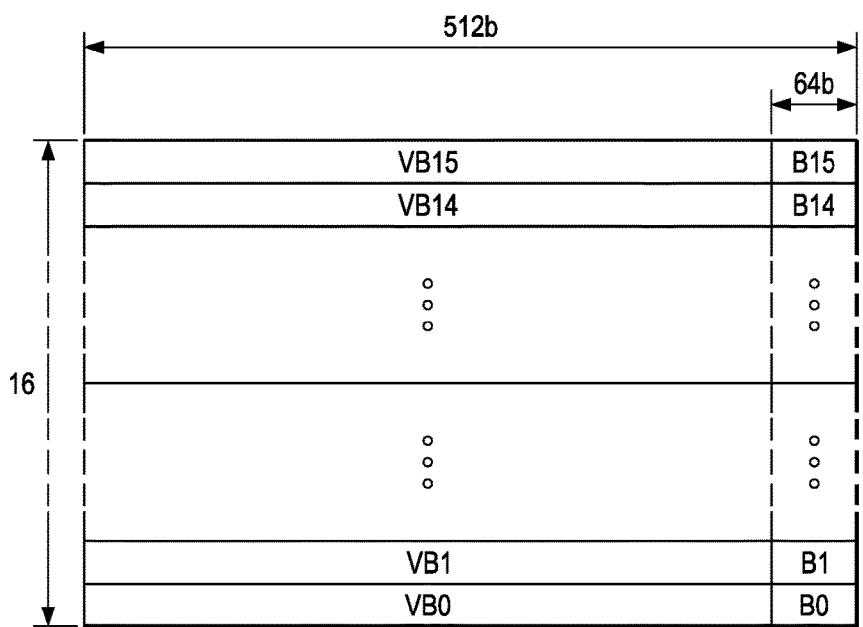
FIG. 7 illustrates a global vector register file.

FIG. 7 illustrates global vector register file 231. There are 16 independent 512-bit wide scalar registers. Each register of global vector register file 231 can be read from or written to as 64-bits of scalar data designated BC to B15. Each register of global vector register file 231 can be read from or written to as 512-bits of vector data designated VB0 to VB15. The instruction type determines the data size. All vector datapath side B 116 functional units (L2 unit 241, S2 unit 242, M2 unit 243, N2 unit 244, C unit 245 and P unit 246) can read or write to global vector register file 231. Scalar datapath side A 115 functional units (L1 unit 221, S1 unit 222, M1 unit 223, N1 unit 224, D1 unit 225 and D2 unit 226) can read from global vector register file 231 via crosspath 117 under restrictions that will be detailed below.

Figure 8:
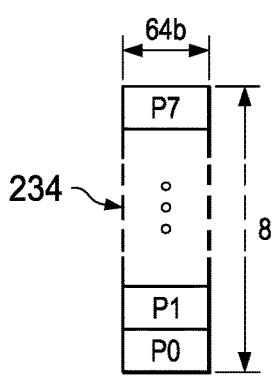
FIG. 8 illustrates a predicate register file.

FIG. 8 illustrates P local register file 234. There are 8 independent 64-bit wide registers designated P0 to P15. Each register of P local register file 234 can be read from or written to as 64-bits of scalar data. Vector datapath side B 116 functional units L2 unit 241, S2 unit 242, C unit 244 and P unit 246 can write to P local register file 234. Only L2 unit 241, S2 unit 242 and P unit 246 can read from P local scalar register file 234. A commonly expected use of P local register file 234 includes: writing one bit SIMD vector comparison results from L2 unit 241, S2 unit 242 or C unit 244; manipulation of the SIMD vector comparison results by P unit 246; and use of the manipulated results in control of a further SIMD vector operation.

Figure 9:
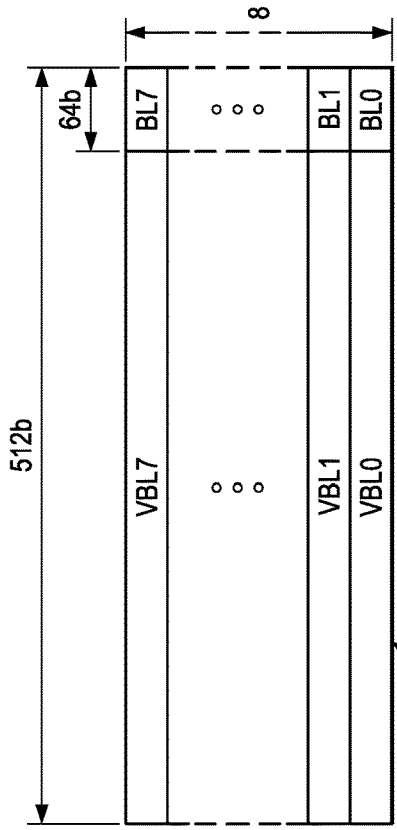
FIG. 9 illustrates a local vector register file shared by arithmetic functional units.

FIG. 9 illustrates L2/S2 local register file 232. The embodiment illustrated in FIG. 9 has 8 independent 512-bit wide scalar registers. The preferred instruction coding (see FIG. 13) permits L2/S2 local register file 232 to include up to 16 registers. The embodiment of FIG. 9 implements only 8 registers to reduce circuit size and complexity. Each register of L2/S2 local vector register file 232 can be read from or written to as 64-bits of scalar data designated BL0 to BL7. Each register of L2/S2 local vector register file 232 can be read from or written to as 512-bits of vector data designated VBL0 to VBL7. The instruction type determines the data size. All vector datapath side B 116 functional units (L2 unit 241, S2 unit 242, M2 unit 243, N2 unit 244, C unit 245 and P unit 246) can write to L2/S2 local vector register file 232. Only L2 unit 241 and S2 unit 242 can read from L2/S2 local vector register file 232.

Figure 10:
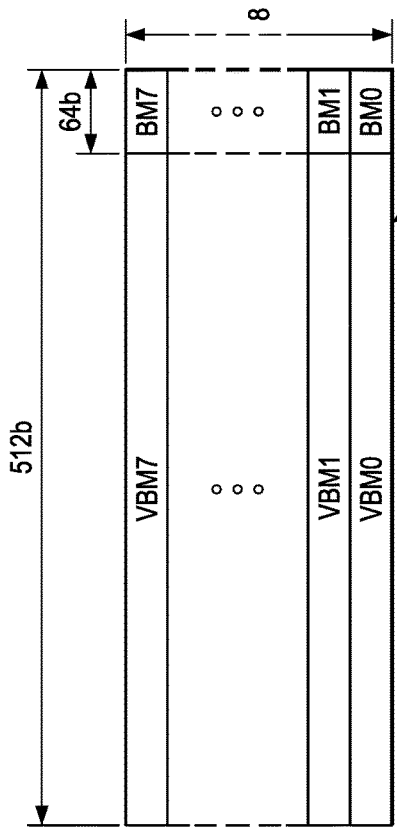
FIG. 10 illustrates a local vector register file shared by multiply and correlation functional units.

FIG. 10 illustrates M2/N2/C local register file 233. The embodiment illustrated in FIG. 10 has 8 independent 512-bit wide scalar registers. The preferred instruction coding (see FIG. 13) permits M2/N2/C local register file 233 to include up to 16 registers. The embodiment of FIG. 10 implements only 8 registers to reduce circuit size and complexity. Each register of M2/N2/C local vector register file 233 can be read from or written to as 64-bits of scalar data designated BM0 to BM7. Each register of M2/N2/C local vector register file 233 can be read from or written to as 512-bits of vector data designated VBM0 to VBM7. All vector datapath side B 116 functional units (L2 unit 241, S2 unit 242, M2 unit 243, N2 unit 244, C unit 245 and P unit 246) can write to M2/N2/C local vector register file 233. Only M2 unit 243, N2 unit 244 and C unit 245 can read from M2/N2/C local vector register file 233.

The provision of global register files accessible by all functional units of a side and local register files accessible by only some of the functional units of a side is a design choice. This invention could be practiced employing only one type of register file corresponding to the disclosed global register files.

Crosspath 117 permits limited exchange of data between scalar datapath side A 115 and vector datapath side B 116. During each operational cycle one 64-bit data word can be recalled from global scalar register file A 211 for use as an operand by one or more functional units of vector datapath side B 116 and one 64-bit data word can be recalled from global vector register file 231 for use as an operand by one or more functional units of scalar datapath side A 115. Any scalar datapath side A 115 functional unit (L1 unit 221, S1 unit 222, M1 unit 223, N1 unit 224, D1 unit 225 and D2 unit 226) may read a 64-bit operand from global vector register file 231. This 64-bit operand is the least significant bits of the 512-bit data in the accessed register of global vector register file 231. Plural scalar datapath side A 115 functional units may employ the same 64-bit crosspath data as an operand during the same operational cycle. However, only one 64-bit operand is transferred from vector datapath side B 116 to scalar datapath side A 115 in any single operational cycle. Any vector datapath side B 116 functional unit (L2 unit 241, S2 unit 242, M2 unit 243, N2 unit 244, C unit 245 and P unit 246) may read a 64-bit operand from global scalar register file 211. If the corresponding instruction is a scalar instruction, the crosspath operand data is treated as any other 64-bit operand. If the corresponding instruction is a vector instruction, the upper 448 bits of the operand are zero filled. Plural vector datapath side B 116 functional units may employ the same 64-bit crosspath data as an operand during the same operational cycle. Only one 64-bit operand is transferred from scalar datapath side A 115 to vector datapath side B 116 in any single operational cycle.

Streaming engine 125 transfers data in certain restricted circumstances. Streaming engine 125 controls two data streams. A stream consists of a sequence of elements of a particular type. Programs that operate on streams read the data sequentially, operating on each element in turn. Every stream has the following basic properties. The stream data have a well-defined beginning and ending in time. The stream data have fixed element size and type throughout the stream. The stream data have fixed sequence of elements. Thus programs cannot seek randomly within the stream. The stream data is read-only while active. Programs cannot write to a stream while simultaneously reading from it. Once a stream is opened streaming engine 125: calculates the address; fetches the defined data type from level two unified cache (which may require cache service from a higher level memory); performs data type manipulation such as zero extension, sign extension, data element sorting/swapping such as matrix transposition; and delivers the data directly to the programmed data register file within central processing unit core 110. Streaming engine 125 is thus useful for real-time digital filtering operations on well-behaved data. Streaming engine 125 frees these memory fetch tasks from the corresponding central processing unit core 110 enabling other processing functions.

Streaming engine 125 provides the following benefits. Streaming engine 125 permits multi-dimensional memory accesses. Streaming engine 125 increases the available bandwidth to the functional units. Streaming engine 125 minimizes the number of cache miss stalls since the stream buffer bypasses level one data cache 123. Streaming engine 125 reduces the number of scalar operations required to maintain a loop. Streaming engine 125 manages address pointers. Streaming engine 125 handles address generation automatically freeing up the address generation instruction slots and D1 unit 225 and D2 unit 226 for other computations.

Central processing unit core 110 operates on an instruction pipeline. Instructions are fetched in instruction packets of fixed length further described below. All instructions require the same number of pipeline phases for fetch and decode, but require a varying number of execute phases.

Figure 11:
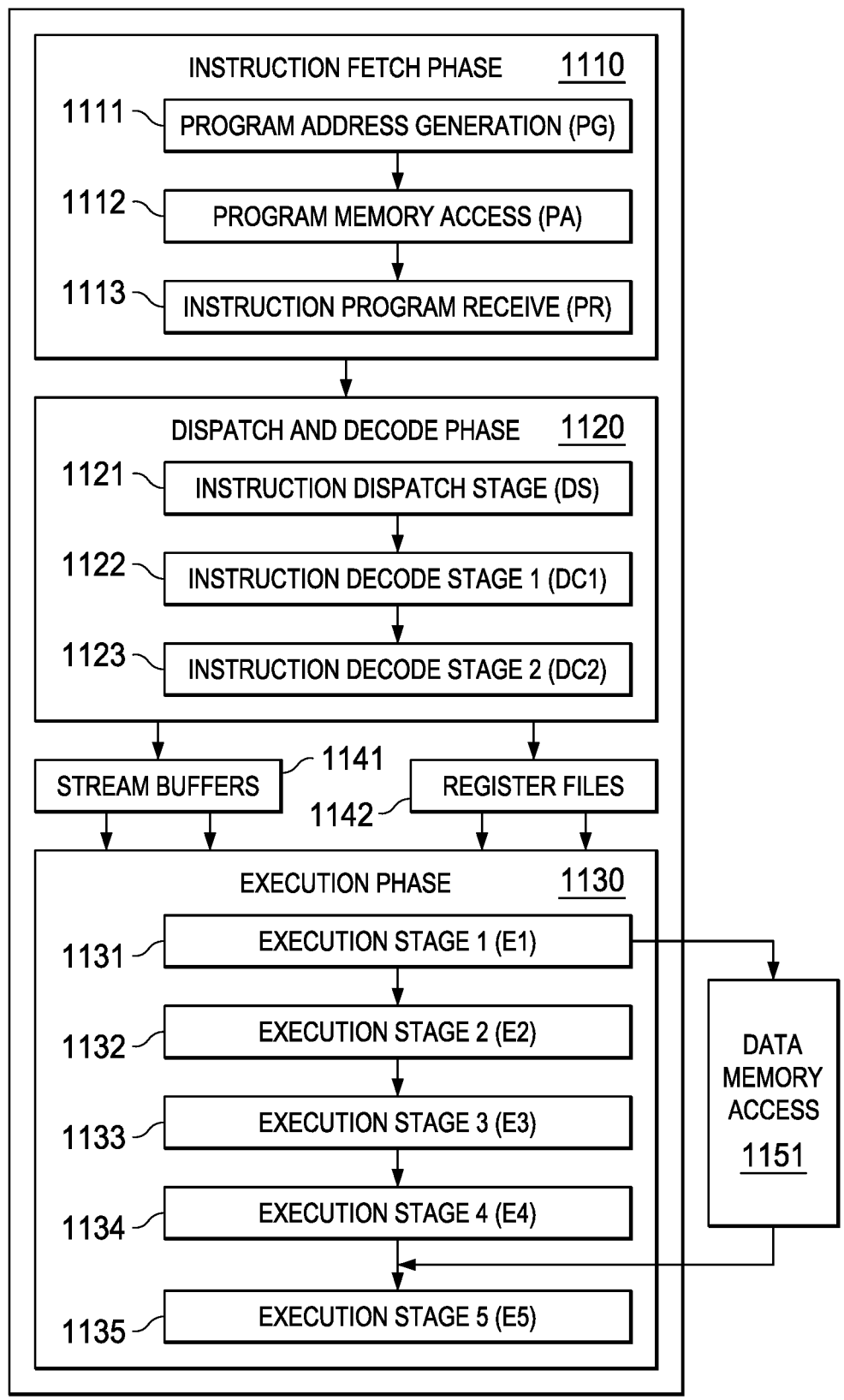
FIG. 11 illustrates pipeline phases of a central processing unit according to a preferred embodiment of this invention.

FIG. 11 illustrates the following pipeline phases: program fetch phase 1110, dispatch and decode phases 1120 and execution phases 1130. Program fetch phase 1110 includes three stages for all instructions. Dispatch and decode phases 1120 include three stages for all instructions. Execution phase 1130 includes one to four stages dependent on the instruction.

Fetch phase 1110 includes program address generation stage 1111 (PG), program access stage 1112 (PA) and program receive stage 1113 (PR). During program address generation stage 1111 (PG), the program address is generated in central processing unit core 110 and the read request is sent to the memory controller for the level one instruction cache L1I. During the program access stage 1112 (PA) the level one instruction cache L1I processes the request, accesses the data in its memory and sends a fetch packet to the central processing unit core 110 boundary. During the program receive stage 1113 (PR) central processing unit core 110 registers the fetch packet.

Figure 12:
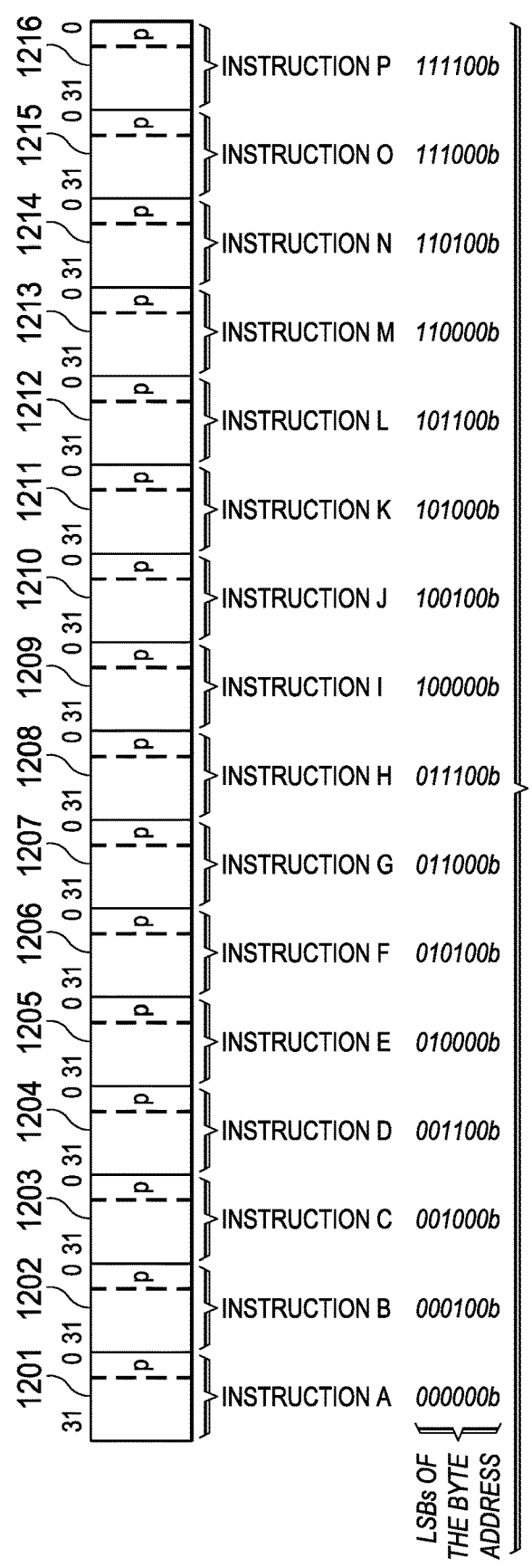
FIG. 12 illustrates sixteen instructions of a single fetch packet.

Instructions are always fetched sixteen 32-bit wide slots, constituting a fetch packet, at a time. FIG. 12 illustrates 16 instructions 1201 to 1216 of a single fetch packet. Fetch packets are aligned on 512-bit (16-word) boundaries. The preferred embodiment employs a fixed 32-bit instruction length. Fixed length instructions are advantageous for several reasons. Fixed length instructions enable easy decoder alignment. A properly aligned instruction fetch can load plural instructions into parallel instruction decoders. Such a properly aligned instruction fetch can be achieved by predetermined instruction alignment when stored in memory (fetch packets aligned on 512-bit boundaries) coupled with a fixed instruction packet fetch. An aligned instruction fetch permits operation of parallel decoders on instruction-sized fetched bits. Variable length instructions require an initial step of locating each instruction boundary before they can be decoded. A fixed length instruction set generally permits more regular layout of instruction fields. This simplifies the construction of each decoder which is an advantage for a wide issue VLIW central processor.

The execution of the individual instructions is partially controlled by a p bit in each instruction. This p bit is preferably bit 0 of the 32-bit wide slot. The p bit determines whether an instruction executes in parallel with a next instruction. Instructions are scanned from lower to higher address. If the p bit of an instruction is 1, then the next following instruction (higher memory address) is executed in parallel with (in the same cycle as) that instruction. If the p bit of an instruction is 0, then the next following instruction is executed in the cycle after the instruction.

Central processing unit core 110 and level one instruction cache L1I 121 pipelines are de-coupled from each other. Fetch packet returns from level one instruction cache L1I can take different number of clock cycles, depending on external circumstances such as whether there is a hit in level one instruction cache 121 or a hit in level two combined cache 130. Therefore program access stage 1112 (PA) can take several clock cycles instead of 1 clock cycle as in the other stages.

The instructions executing in parallel constitute an execute packet. In the preferred embodiment an execute packet can contain up to sixteen instructions. No two instructions in an execute packet may use the same functional unit. A slot is one of five types: 1) a self-contained instruction executed on one of the functional units of central processing unit core 110 (L1 unit 221, S1 unit 222, M1 unit 223, N1 unit 224, D1 unit 225, D2 unit 237, L2 unit 241, S2 unit 242, M2 unit 243, N2 unit 244, C unit 245 and P unit 246); 2) a unitless instruction such as a NOP (no operation) instruction or multiple NOP instruction; 3) a branch instruction; 4) a constant field extension; and 5) a conditional code extension. Some of these slot types will be further explained below.

Dispatch and decode phases 1110 include instruction dispatch to appropriate execution unit stage 1121 (DS), instruction pre-decode stage 1122 (DC1); and instruction decode, operand reads stage 1123 (DC2). During instruction dispatch to appropriate execution unit stage 1121 (DS) the fetch packets are split into execute packets and assigned to the appropriate functional units. During the instruction pre-decode stage 1122 (DC1) the source registers, destination registers and associated paths are decoded for the execution of the instructions in the functional units. During the instruction decode, operand reads stage 1123 (DC2), more detailed unit decodes are done, as well as reading operands from the register files.

Execution phases 1130 includes execution stages 1131 to 1135 (E1 to E5). Different types of instructions require different numbers of these stages to complete their execution. These stages of the pipeline play an important role in understanding the device state at central processing unit core 110 cycle boundaries.

During execute 1 stage 1131 (E1) the conditions for the instructions are evaluated and operands are operated on. As illustrated in FIG. 11, execute 1 stage 1131 may receive operands from a stream buffer 1141 and one of the register files shown schematically as 1142. For load and store instructions, address generation is performed and address modifications are written to a register file. For branch instructions, branch fetch packet in PG phase 1111 is affected. As illustrated in FIG. 11, load and store instructions access memory here shown schematically as memory 1151. For single-cycle instructions, results are written to a destination register file. This assumes that any conditions for the instructions are evaluated as true. If a condition is evaluated as false, the instruction does not write any results or have any pipeline operation after execute 1 stage 1131.

During execute 2 stage 1132 (E2) load instructions send the address to memory. Store instructions send the address and data to memory. Single-cycle instructions that saturate results set the SAT bit in the control status register (CSR) if saturation occurs. For 2-cycle instructions, results are written to a destination register file.

During execute 3 stage 1133 (E3) data memory accesses are performed. Any multiply instructions that saturate results set the SAT bit in the control status register (CSR) if saturation occurs. For 3-cycle instructions, results are written to a destination register file.

During execute 4 stage 1134 (E4) load instructions bring data to the central processing unit core 110 boundary. For 4-cycle instructions, results are written to a destination register file.

During execute 5 stage 1135 (E5) load instructions write data into a register. This is illustrated schematically in FIG. 11 with input from memory 1151 to execute 5 stage 1135.

FIG. 13 illustrates an example of the instruction coding 1300 of functional unit instructions used by this invention. Those skilled in the art would realize that other instruction codings are feasible and within the scope of this invention. Each instruction consists of 32 bits and controls the operation of one of the individually controllable functional units (L1 unit 221, S1 unit 222, M1 unit 223, N1 unit 224, D1 unit 225, D2 unit 237, L2 unit 241, S2 unit 242, M2 unit 243, N2 unit 244, C unit 245 and P unit 246). The bit fields are defined as follows.

The creg field 1301 (bits 29 to 31) and the z bit 1302 (bit 28) are optional fields used in conditional instructions. These bits are used for conditional instructions to identify the predicate register and the condition. The z bit 1302 (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field 1301 and the z field 1302 are encoded in the instruction as shown in Table 1.

TABLE 1

| Conditional Register | creg | | | z |
|---|---|---|---|---|
| | 31 | 30 | 29 | 28 |
| Unconditional | 0 | 0 | 0 | 0 |
| Reserved | 0 | 0 | 0 | 1 |
| A0 | 0 | 0 | 1 | z |
| A1 | 0 | 1 | 0 | z |
| A2 | 0 | 1 | 1 | z |
| A3 | 1 | 0 | 0 | z |
| A4 | 1 | 0 | 1 | z |
| A5 | 1 | 1 | 0 | z |
| Reserved | 1 | 1 | x | x |

Execution of a conditional instruction is conditional upon the value stored in the specified data register. This data register is in the global scalar register file 211 for all functional units. Note that "z" in the z bit column refers to the zero/not zero comparison selection and "x" is a don't care state. This coding can only specify a subset of the 16 global registers as predicate registers. This selection was made to preserve bits in the instruction coding. Note that unconditional instructions do not have these optional bits. For unconditional instructions these bits in fields 1301 and 1302 (28 to 31) are preferably used as additional opcode bits.

The dst field 1303 (bits 23 to 27) specifies a register in a corresponding register file as the destination of the instruction results.

The src2/cst field 1304 (bits 18 to 22) has several meanings depending on the instruction opcode field (bits 3 to 12 for all instructions and additionally bits 28 to 31 for unconditional instructions). The first meaning specifies a register of a corresponding register file as the second operand. The second meaning is an immediate constant. Depending on the instruction type, this is treated as an unsigned integer and zero extended to a specified data length or is treated as a signed integer and sign extended to the specified data length.

The src1 field 1305 (bits 13 to 17) specifies a register in a corresponding register file as the first source operand.

The opcode field 1306 (bits 3 to 12) for all instructions (and additionally bits 28 to 31 for unconditional instructions) specifies the type of instruction and designates appropriate instruction options. This includes unambiguous designation of the functional unit used and operation performed. A detailed explanation of the opcode is beyond the scope of this invention except for the instruction options detailed below.

The e bit 1307 (bit 2) is only used for immediate constant instructions where the constant may be extended. If e=1, then the immediate constant is extended in a manner detailed below. If e=0, then the immediate constant is not extended. In that case the immediate constant is specified by the src2/cst field 1304 (bits 18 to 22). Note that this e bit 1307 is used for only some instructions. Accordingly, with proper coding this e bit 1307 may be omitted from instructions which do not need it and this bit used as an additional opcode bit.

The s bit 1308 (bit 1) designates scalar datapath side A 115 or vector datapath side B 116. If s=0, then scalar datapath side A 115 is selected. This limits the functional unit to L1 unit 221, S1 unit 222, M1 unit 223, N1 unit 224, D1 unit 225 and D2 unit 226 and the corresponding register files illustrated in FIG. 2. Similarly, s=1 selects vector datapath side B 116 limiting the functional unit to L2 unit 241, S2 unit 242, M2 unit 243, N2 unit 244, P unit 246 and the corresponding register file illustrated in FIG. 2.

The p bit 1309 (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to twelve instructions. Each instruction in an execute packet must use a different functional unit.

There are two different condition code extension slots. Each execute packet can contain one each of these unique 32-bit condition code extension slots which contains the 4-bit creg/z fields for the instructions in the same execute packet. FIG. 14 illustrates the coding for condition code extension slot 0 and FIG. 15 illustrates the coding for condition code extension slot 1.

FIG. 14 illustrates the coding for condition code extension slot 0 having 32 bits. Field 1401 (bits 28 to 31) specify 4 creg/z bits assigned to the L1 unit 221 instruction in the same execute packet. Field 1402 (bits 27 to 24) specify 4 creg/z bits assigned to the L2 unit 241 instruction in the same execute packet. Field 1403 (bits 19 to 23) specify 4 creg/z bits assigned to the S1 unit 222 instruction in the same execute packet. Field 1404 (bits 16 to 19) specify 4 creg/z bits assigned to the S2 unit 242 instruction in the same execute packet. Field 1405 (bits 12 to 15) specify 4 creg/z bits assigned to the D1 unit 225 instruction in the same execute packet. Field 1406 (bits 8 to 11) specify 4 creg/z bits assigned to the D2 unit 226 instruction in the same execute packet. Field 1407 (bits 6 and 7) is unused/reserved. Field 1408 (bits 0 to 5) are coded a set of unique bits (CCEX0) to identify the condition code extension slot 0. Once this unique ID of condition code extension slot 0 is detected, the corresponding creg/z bits are employed to control conditional execution of any L1 unit 221, L2 unit 241, S1 unit 222, S2 unit 242, D1 unit 225 and D2 unit 226 instruction in the same execution packet. These creg/z bits are interpreted as shown in Table 1. If the corresponding instruction is conditional (includes creg/z bits) the corresponding bits in the condition code extension slot 0 override the condition code bits in the instruction. Note that no execution packet can have more than one instruction directed to a particular execution unit. No execute packet of instructions can contain more than one condition code extension slot 0. Thus the mapping of creg/z bits to functional unit instruction is unambiguous. Setting the creg/z bits equal to "0000" makes the instruction unconditional. Thus a properly coded condition code extension slot 0 can make some corresponding instructions conditional and some unconditional.

FIG. 15 illustrates the coding for condition code extension slot 1 having 32 bits. Field 1501 (bits 28 to 31) specify 4 creg/z bits assigned to the M1 unit 223 instruction in the same execute packet. Field 1502 (bits 27 to 24) specify 4 creg/z bits assigned to the M2 unit 243 instruction in the same execute packet. Field 1503 (bits 19 to 23) specify 4 creg/z bits assigned to the C unit 245 instruction in the same execute packet. Field 1504 (bits 16 to 19) specify 4 creg/z bits assigned to the N1 unit 224 instruction in the same execute packet. Field 1505 (bits 12 to 15) specify 4 creg/z bits assigned to the N2 unit 244 instruction in the same execute packet. Field 1506 (bits 6 to 11) is unused/reserved. Field 1507 (bits 0 to 5) are coded a set of unique bits (CCEX1) to identify the condition code extension slot 1. Once this unique ID of condition code extension slot 1 is detected, the corresponding creg/z bits are employed to control conditional execution of any M1 unit 223, M2 unit 243, C unit 245, N1 unit 224 and N2 unit 244 instruction in the same execution packet. These creg/z bits are interpreted as shown in Table 1. If the corresponding instruction is conditional (includes creg/z bits) the corresponding bits in the condition code extension slot 1 override the condition code bits in the instruction. Note that no execution packet can have more than one instruction directed to a particular execution unit. No execute packet of instructions can contain more than one condition code extension slot 1. Thus the mapping of creg/z bits to functional unit instruction is unambiguous. Setting the creg/z bits equal to "0000" makes the instruction unconditional. Thus a properly coded condition code extension slot 1 can make some instructions conditional and some unconditional.

It is feasible for both condition code extension slot 0 and condition code extension slot 1 to include a p bit to define an execute packet as described above in conjunction with FIG. 13. In the preferred embodiment, as illustrated in FIGS. 14 and 15, code extension slot 0 and condition code extension slot 1 preferably have bit 0 (p bit) always encoded as 1. Thus neither condition code extension slot 0 nor condition code extension slot 1 can be in the last instruction slot of an execute packet.

There are two different constant extension slots. Each execute packet can contain one each of these unique 32-bit constant extension slots which contains 27 bits to be concatenated as high order bits with the 5-bit constant field 1305 to form a 32-bit constant. Only some instructions define the src2/cst field 1304 as a constant rather than a source register identifier. At least some of those instructions may employ a constant extension slot to extend this constant to 32 bits.

FIG. 16 illustrates the fields of constant extension slot 0. Each execute packet may include one instance of constant extension slot 0 and one instance of constant extension slot 1. FIG. 16 illustrates that constant extension slot 0 1600 includes two fields. Field 1601 (bits 5 to 31) constitute the most significant 27 bits of an extended 32-bit constant including the target instruction scr2/cst field 1304 as the five least significant bits. Field 1602 (bits 0 to 4) are coded a set of unique bits (CSTX0) to identify the constant extension slot 0. In the preferred embodiment constant extension slot 0 1600 can only be used to extend the constant of one of an L1 unit 221 instruction, data in a D1 unit 225 instruction, an S2 unit 242 instruction, an offset in a D2 unit 237 instruction, an M2 unit 243 instruction, an N2 unit 244 instruction, a branch instruction, or a C unit 245 instruction in the same execute packet. Constant extension slot 1 is similar to constant extension slot 0 except that bits 0 to 4 are coded a set of unique bits (CSTX1) to identify the constant extension slot 1. In the preferred embodiment constant extension slot 1 can only be used to extend the constant of one of an L2 unit 241 instruction, data in a D2 unit 237 instruction, an S1 unit 222 instruction, an offset in a D1 unit 225 instruction, an M1 unit 223 instruction or an N1 unit 224 instruction in the same execute packet.

Constant extension slot 0 and constant extension slot 1 are used as follows. The target instruction must be of the type permitting constant specification. As known in the art this is implemented by replacing one input operand register specification field with the least significant bits of the constant as described above with respect to scr2/cst field 1304. Instruction decoder 113 determines this case, known as an immediate field, from the instruction opcode bits. The target instruction also includes one constant extension bit (e bit 1307) dedicated to signaling whether the specified constant is not extended (preferably constant extension bit=0) or the constant is extended (preferably constant extension bit=1). If instruction decoder 113 detects a constant extension slot 0 or a constant extension slot 1, it further checks the other instructions within that execute packet for an instruction corresponding to the detected constant extension slot. A constant extension is made only if one corresponding instruction has a constant extension bit (e bit 1307) equal to 1.

Figure 17:
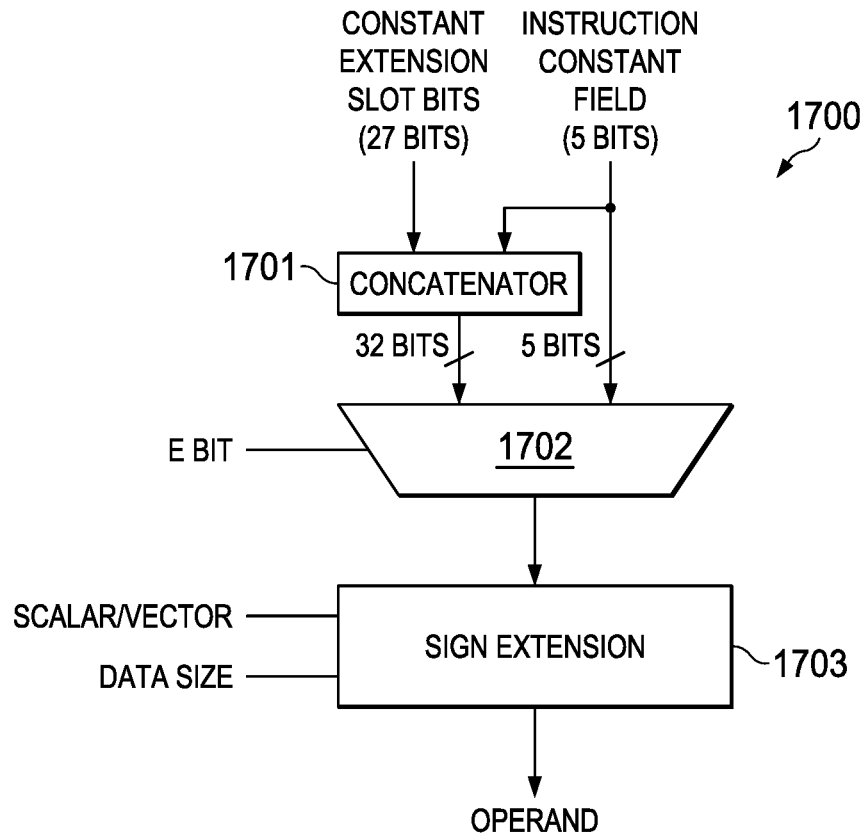
FIG. 17 is a partial block diagram illustrating constant extension.

FIG. 17 is a partial block diagram 1700 illustrating constant extension. FIG. 17 assumes that instruction decoder 113 detects a constant extension slot and a corresponding instruction in the same execute packet. Instruction decoder 113 supplies the 27 extension bits from the constant extension slot (bit field 1601) and the 5 constant bits (bit field 1305) from the corresponding instruction to concatenator 1701. Concatenator 1701 forms a single 32-bit word from these two parts. In the preferred embodiment the 27 extension bits from the constant extension slot (bit field 1601) are the most significant bits and the 5 constant bits (bit field 1305) are the least significant bits. This combined 32-bit word is supplied to one input of multiplexer 1702. The 5 constant bits from the corresponding instruction field 1305 supply a second input to multiplexer 1702. Selection of multiplexer 1702 is controlled by the status of the constant extension bit. If the constant extension bit (e bit 1307) is 1 (extended), multiplexer 1702 selects the concatenated 32-bit input. If the constant extension bit is 0 (not extended), multiplexer 1702 selects the 5 constant bits from the corresponding instruction field 1305. Multiplexer 1702 supplies this output to an input of sign extension unit 1703.

Sign extension unit 1703 forms the final operand value from the input from multiplexer 1703. Sign extension unit 1703 receives control inputs Scalar/Vector and Data Size. The Scalar/Vector input indicates whether the corresponding instruction is a scalar instruction or a vector instruction. The functional units of data path side A 115 (L1 unit 221, S1 unit 222, M1 unit 223, N1 unit 224, D1 unit 225 and D2 unit 237) can only perform scalar instructions. Any instruction directed to one of these functional units is a scalar instruction. Data path side B functional units L2 unit 241, S2 unit 242, M2 unit 243, N2 unit 244 and C unit 245 may perform scalar instructions or vector instructions. Instruction decoder 113 determines whether the instruction is a scalar instruction or a vector instruction from the opcode bits. P unit 246 may only preform scalar instructions. The Data Size may be 8 bits (byte B), 16 bits (half-word H), 32 bits (word W) or 64 bits (double word D).

Table 2 lists the operation of sign extension unit 1703 for the various options.

TABLE 2

| Instruction Type | Operand Size | Constant Length | Action |
| --- | --- | --- | --- |
| Scalar | B/H/W/D | 5 bits | Sign extend to 64 bits |
| Scalar | B/H/W/D | 32 bits | Sign extend to 64 bits |
| Vector | B/H/W/D | 5 bits | Sign extend to operand size and replicate across whole vector |
| Vector | B/H/W | 32 bits | Replicate 32-bit constant across each 32-bit (W) lane |
| Vector | D | 32 bits | Sign extend to 64 bits and replicate across each 64-bit (D) lane |

It is feasible for both constant extension slot 0 and constant extension slot 1 to include a p bit to define an execute packet as described above in conjunction with FIG. 13. In the preferred embodiment, as in the case of the condition code extension slots, constant extension slot 0 and constant extension slot 1 preferably have bit 0 (p bit) always encoded as 1. Thus neither constant extension slot 0 nor constant extension slot 1 can be in the last instruction slot of an execute packet.

It is technically feasible for an execute packet to include a constant extension slot 0 or 1 and more than one corresponding instruction marked constant extended (e bit=1). For constant extension slot 0 this would mean more than one of an L1 unit 221 instruction, data in a D1 unit 225 instruction, an S2 unit 242 instruction, an offset in a D2 unit 237 instruction, an M2 unit 243 instruction or an N2 unit 244 instruction in an execute packet have an e bit of 1. For constant extension slot 1 this would mean more than one of an L2 unit 241 instruction, data in a D2 unit 237 instruction, an S1 unit 222 instruction, an offset in a D1 unit 225 instruction, an M1 unit 223 instruction or an N1 unit 224 instruction in an execute packet have an e bit of 1. Supplying the same constant extension to more than one instruction is not expected to be a useful function. Accordingly, in one embodiment instruction decoder 113 may determine this case an invalid operation and not supported. Alternately, this combination may be supported with extension bits of the constant extension slot applied to each corresponding functional unit instruction marked constant extended.

Special vector predicate instructions use registers in predicate register file 234 to control vector operations. In the current embodiment all these SIMD vector predicate instructions operate on selected data sizes. The data sizes may include byte (8 bit) data, half word (16 bit) data, word (32 bit) data, double word (64 bit) data, quad word (128 bit) data and half vector (256 bit) data. Each bit of the predicate register controls whether a SIMD operation is performed upon the corresponding byte of data. The operations of P unit 245 permit a variety of compound vector SIMD operations based upon more than one vector comparison. For example a range determination can be made using two comparisons. A candidate vector is compared with a first vector reference having the minimum of the range packed within a first data register. A second comparison of the candidate vector is made with a second reference vector having the maximum of the range packed within a second data register. Logical combinations of the two resulting predicate registers would permit a vector conditional operation to determine whether each data part of the candidate vector is within range or out of range.

L1 unit 221, S1 unit 222, L2 unit 241, S2 unit 242 and C unit 245 often operate in a single instruction multiple data (SIMD) mode. In this SIMD mode the same instruction is applied to packed data from the two operands. Each operand holds plural data elements disposed in predetermined slots. SIMD operation is enabled by carry control at the data boundaries. Such carry control enables operations on varying data widths.

Figure 18:
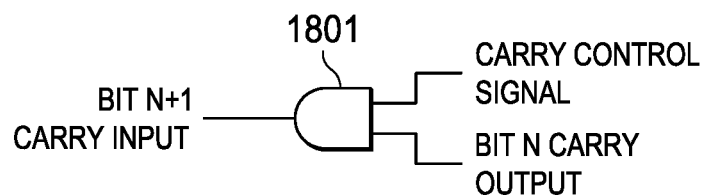
FIG. 18 illustrates carry control for SIMD operations according to this invention.

FIG. 18 illustrates the carry control. AND gate 1801 receives the carry output of bit N within the operand wide arithmetic logic unit (64 bits for scalar datapath side A 115 functional units and 512 bits for vector datapath side B 116 functional units). AND gate 1801 also receives a carry control signal which will be further explained below. The output of AND gate 1801 is supplied to the carry input of bit N+1 of the operand wide arithmetic logic unit. AND gates such as AND gate 1801 are disposed between every pair of bits at a possible data boundary. For example, for 8-bit data such an AND gate will be between bits 7 and 8, bits 15 and 16, bits 23 and 24, etc. Each such AND gate receives a corresponding carry control signal. If the data size is of the minimum, then each carry control signal is 0, effectively blocking carry transmission between the adjacent bits. The corresponding carry control signal is 1 if the selected data size requires both arithmetic logic unit sections. Table 3 below shows example carry control signals for the case of a 512 bit wide operand such as used by vector datapath side B 116 functional units which may be divided into sections of 8 bits, 16 bits, 32 bits, 64 bits, 128 bits or 256 bits. In Table 3 the upper 32 bits control the upper bits (bits 128 to 511) carries and the lower 32 bits control the lower bits (bits 0 to 127) carries. No control of the carry output of the most significant bit is needed, thus only 63 carry control signals are required.

TABLE 3

| Data Size | Carry Control Signals | | | | | | | |
| --- | --- | --- | --- | --- | --- | --- | --- | --- |
| 8 bits (B) | –000 | 0000 | 0000 | 0000 | 0000 | 0000 | 0000 | 0000 |
| | 0000 | 0000 | 0000 | 0000 | 0000 | 0000 | 0000 | 0000 |
| 16 bits (H) | –101 | 0101 | 0101 | 0101 | 0101 | 0101 | 0101 | 0101 |
| | 0101 | 0101 | 0101 | 0101 | 0101 | 0101 | 0101 | 0101 |
| 32 bits (W) | –111 | 0111 | 0111 | 0111 | 0111 | 0111 | 0111 | 0111 |
| | 0111 | 0111 | 0111 | 0111 | 0111 | 0111 | 0111 | 0111 |
| 64 bits (D) | –111 | 1111 | 0111 | 1111 | 0111 | 1111 | 0111 | 1111 |
| | 0111 | 1111 | 0111 | 1111 | 0111 | 1111 | 0111 | 1111 |
| 128 bits | –111 | 1111 | 1111 | 1111 | 0111 | 1111 | 1111 | 1111 |
| | 0111 | 1111 | 1111 | 1111 | 0111 | 1111 | 1111 | 1111 |
| 256 bits | –111 | 1111 | 1111 | 1111 | 1111 | 1111 | 1111 | 1111 |
| | 0111 | 1111 | 1111 | 1111 | 1111 | 1111 | 1111 | 1111 |

It is typical in the art to operate on data sizes that are integral powers of 2 ($2^N$). However, this carry control technique is not limited to integral powers of 2. One skilled in the art would understand how to apply this technique to other data sizes and other operand widths.

Figure 19:
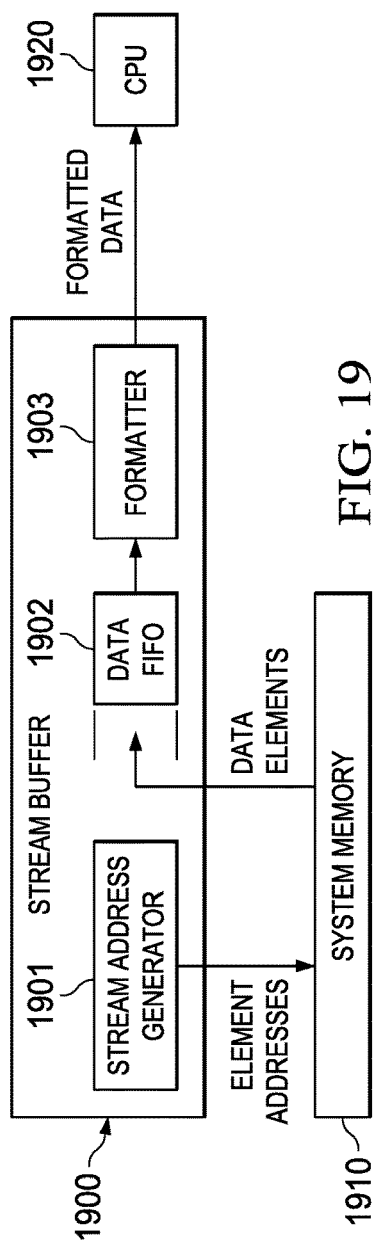
FIG. 19 illustrates a conceptual view of the streaming engines of this invention.

FIG. 19 illustrates a conceptual view of the streaming engines of this invention. FIG. 19 illustrates the process of a single stream. Streaming engine 1900 includes stream address generator 1901. Stream address generator 1901 sequentially generates addresses of the elements of the stream and supplies these element addresses to system memory 1910. Memory 1910 recalls data stored at the element addresses (data elements) and supplies these data elements to data first-in-first-out (FIFO) memory 1902. Data FIFO 1902 provides buffering between memory 1910 and CPU 1920. Data formatter 1903 receives the data elements from data FIFO memory 1902 and provides data formatting according to the stream definition. This process will be described below. Streaming engine 1900 supplies the formatted data elements from data formatter 1903 to the CPU 1920. The program on CPU 1920 consumes the data and generates an output.

Stream elements typically reside in normal memory. The memory itself imposes no particular structure upon the stream. Programs define streams and therefore impose structure, by specifying the following stream attributes: address of the first element of the stream; size and type of the elements in the stream; formatting for data in the stream; and the address sequence associated with the stream.

The streaming engine defines an address sequence for elements of the stream in terms of a pointer walking through memory. A multiple-level nested loop controls the path the pointer takes. An iteration count for a loop level indicates the number of times that level repeats. A dimension gives the distance between pointer positions of that loop level.

In a basic forward stream the innermost loop always consumes physically contiguous elements from memory. The implicit dimension of this innermost loop is 1 element. The pointer itself moves from element to element in consecutive, increasing order. In each level outside the inner loop, that loop moves the pointer to a new location based on the size of that loop level's dimension.

This form of addressing allows programs to specify regular paths through memory in a small number of parameters. Table 4 lists the addressing parameters of a basic stream.

TABLE 4

| Parameter | Definition |
| --- | --- |
| ELEM_BYTES | Size of each element in bytes |
| ICNT0 | Number of iterations for the innermost loop level 0. At loop level 0 all elements are physically contiguous DIM0 is ELEM_BYTES |
| ICNT1 | Number of iterations for loop level 1 |
| DIM1 | Number of bytes between the starting points for consecutive iterations of loop level 1 |
| ICNT2 | Number of iterations for loop level 2 |
| DIM2 | Number of bytes between the starting points for consecutive iterations of loop level 2 |
| ICNT3 | Number of iterations for loop level 3 |
| DIM3 | Number of bytes between the starting points for consecutive iterations of loop level 3 |

The definition above maps consecutive elements of the stream to increasing addresses in memory. This works well for most algorithms but not all. Some algorithms are better served by reading elements in decreasing memory addresses, reverse stream addressing. For example, a discrete convolution computes vector dot-products, as per the formula:

$$(f, g)[t] = \sum_{x=-\infty}^{\infty} f[x]g[t-x]$$

In most DSP code, f[ ] and g[ ] represent arrays in memory. For each output, the algorithm reads f[ ] in the forward direction, but reads g[ ] in the reverse direction. Practical filters limit the range of indices for [x] and [t-x] to a finite number elements. To support this pattern, the streaming engine supports reading elements in decreasing address order.

Matrix multiplication presents a unique problem to the streaming engine. Each element in the matrix product is a vector dot product between a row from the first matrix and a column from the second. Programs typically store matrices all in row-major or column-major order. Row-major order stores all the elements of a single row contiguously in memory. Column-major order stores all elements of a single column contiguously in memory. Matrices typically get stored in the same order as the default array order for the language. As a result, only one of the two matrices in a matrix multiplication map on to the streaming engine's 2-dimensional stream definition. In a typical example a first index steps through columns on array first array but rows on second array. This problem is not unique to the streaming engine. Matrix multiplication's access pattern fits poorly with most general-purpose memory hierarchies. Some software libraries transposed one of the two matrices, so that both get accessed row-wise (or column-wise) during multiplication. The streaming engine supports implicit matrix transposition with transposed streams. Transposed streams avoid the cost of explicitly transforming the data in memory. Instead of accessing data in strictly consecutive-element order, the streaming engine effectively interchanges the inner two loop dimensions in its traversal order, fetching elements along the second dimension into contiguous vector lanes.

This algorithm works, but is impractical to implement for small element sizes. Some algorithms work on matrix tiles which are multiple columns and rows together. Therefore, the streaming engine defines a separate transposition granularity. The hardware imposes a minimum granularity. The transpose granularity must also be at least as large as the element size. Transposition granularity causes the streaming engine to fetch one or more consecutive elements from dimension 0 before moving along dimension 1. When the granularity equals the element size, this results in fetching a single column from a row-major array. Otherwise, the granularity specifies fetching 2, 4 or more columns at a time from a row-major array. This is also applicable for column-major layout by exchanging row and column in the description. A parameter GPANULE indicates the transposition granularity in bytes.

Another common matrix multiplication technique exchanges the innermost two loops of the matrix multiply. The resulting inner loop no longer reads down the column of one matrix while reading across the row of another. For example the algorithm may hoist one term outside the inner loop, replacing it with the scalar value. On a vector machine, the innermost loop can be implements very efficiently with a single scalar-by-vector multiply followed by a vector add. The central processing unit core 110 of this invention lacks a scalar-by-vector multiply. Programs must instead duplicate the scalar value across the length of the vector and use a vector-by-vector multiply. The streaming engine of this invention directly supports this and related use models with an element duplication mode. In this mode, the streaming engine reads a granule smaller than the full vector size and replicates that granule to fill the next vector output.

The streaming engine treats each complex number as a single element with two sub-elements that give the real and imaginary (rectangular) or magnitude and angle (polar) portions of the complex number. Not all programs or peripherals agree what order these sub-elements should appear in memory. Therefore, the streaming engine offers the ability to swap the two sub-elements of a complex number with no cost. This feature swaps the halves of an element without interpreting the contents of the element and can be used to swap pairs of sub-elements of any type, not just complex numbers.

Algorithms generally prefer to work at high precision, but high precision values require more storage and bandwidth than lower precision values. Commonly, programs will store data in memory at low precision, promote those values to a higher precision for calculation and then demote the values to lower precision for storage. The streaming engine supports this directly by allowing algorithms to specify one level of type promotion. In the preferred embodiment of this invention every sub-element may be promoted to the next larger type size with either sign or zero extension for integer types. It is also feasible that the streaming engine may support floating point promotion, promoting 16-bit and 32-bit floating point values to 32-bit and 64-bit formats, respectively.

The streaming engine defines a stream as a discrete sequence of data elements, the central processing unit core 110 consumes data elements packed contiguously in vectors. Vectors resemble streams in as much as they contain multiple homogeneous elements with some implicit sequence. Because the streaming engine reads streams, but the central processing unit core 110 consumes vectors, the streaming engine must map streams onto vectors in a consistent way.

Vectors consist of equal-sized lanes, each lane containing a sub-element. The central processing unit core 110 designates the rightmost lane of the vector as lane 0, regardless of device's current endian mode. Lane numbers increase right-to-left. The actual number of lanes within a vector varies depending on the length of the vector and the data size of the sub-element.

Figure 20:
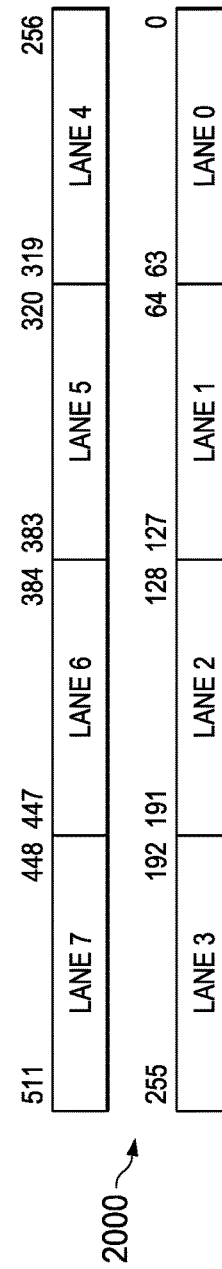
FIG. 20 illustrates a first example of lane allocation in a vector.

FIG. 20 illustrates a first example of lane allocation in a vector. Vector 2000 is divided into 8 64-bit lanes (8x64 bits=512 bits the vector length). Lane 0 includes bits 0 to 63; line 1 includes bits 64 to 127; lane 2 includes bits 128 to 191; lane 3 includes bits 192 to 255, lane 4 includes bits 256 to 319, lane 5 includes bits 320 to 383, lane 6 includes bits 384 to 447 and lane 7 includes bits 448 to 511.

Figure 21:
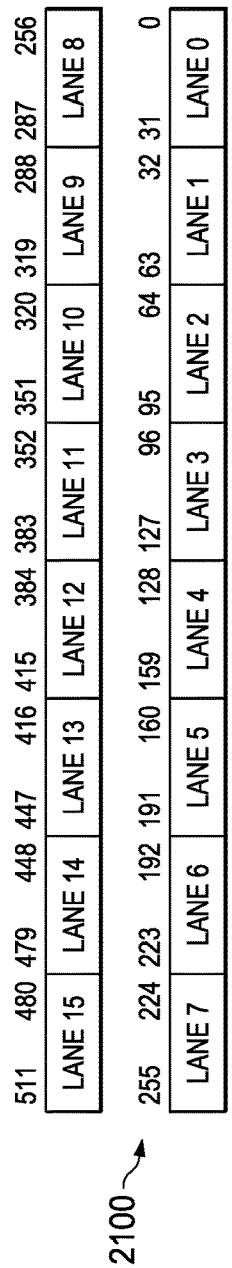
FIG. 21 illustrates a second example of lane allocation in a vector.

FIG. 21 illustrates a second example of lane allocation in a vector. Vector 2100 is divided into 16 32-bit lanes (16×32 bits=512 bits the vector length). Lane 0 includes bits 0 to 31; line 1 includes bits 32 to 63; lane 2 includes bits 64 to 95; lane 3 includes bits 96 to 127; lane 4 includes bits 128 to 159; lane 5 includes bits 160 to 191; lane 6 includes bits 192 to 223; lane 7 includes bits 224 to 255; lane 8 includes bits 256 to 287; line 9 occupied bits 288 to 319; lane 10 includes bits 320 to 351; lane 11 includes bits 352 to 387; lane 12 includes bits 388 to 415; lane 13 includes bits 416 to 447; lane 14 includes bits 448 to 479; and lane 15 includes bits 480 to 511.

The streaming engine maps the innermost stream dimension directly to vector lanes. It maps earlier elements within that dimension to lower lane numbers and later elements to higher lane numbers. This is true regardless of whether this particular stream advances in increasing or decreasing address order. Whatever order the stream defines, the streaming engine deposits elements in vectors in increasing-lane order. For non-complex data, it places the first element in lane 0 of the first vector central processing unit core 110 fetches, the second in lane 1, and so on. For complex data, the streaming engine places the first element in lanes 0 and 1, second in lanes 2 and 3, and so on. Sub-elements within an element retain the same relative ordering regardless of the stream direction. For non-swapped complex elements, this places the sub-elements with the lower address of each pair in the even numbered lanes, and the sub-elements with the higher address of each pair in the odd numbered lanes. Swapped complex elements reverse this mapping.

The streaming engine fills each vector central processing unit core 110 fetches with as many elements as it can from the innermost stream dimension. If the innermost dimension is not a multiple of the vector length, the streaming engine pads that dimension out to a multiple of the vector length with zeros. Thus for higher-dimension streams, the first element from each iteration of an outer dimension arrives in lane 0 of a vector. The streaming engine always maps the innermost dimension to consecutive lanes in a vector. For transposed streams, the innermost dimension consists of groups of sub-elements along dimension 1, not dimension 0, as transposition exchanges these two dimensions.

Two dimensional streams exhibit great variety as compared to one dimensional streams. A basic two dimensional stream extracts a smaller rectangle from a larger rectangle. A transposed 2-D stream reads a rectangle column-wise instead of row-wise. A looping stream, where the second dimension overlaps first executes a finite impulse response (FIR) filter taps which loops repeatedly or FIR filter samples which provide a sliding window of input samples.

Figure 22:
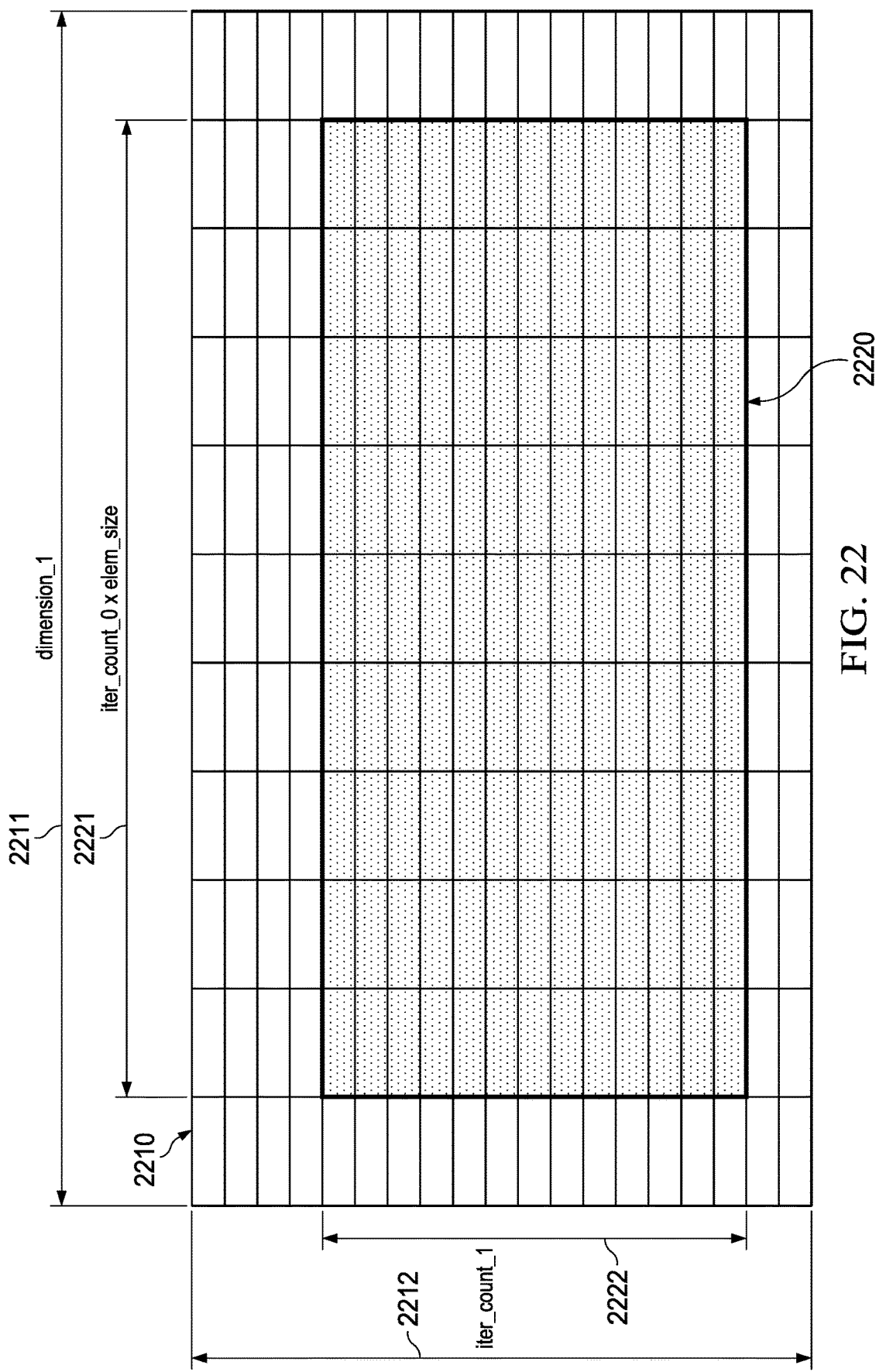
FIG. 22 illustrates a basic two dimensional stream.

FIG. 22 illustrates a basic two dimensional stream. The inner two dimensions, represented by ELEM_BYTES, ICNT0, DIM1 and ICNT1 give sufficient flexibility to describe extracting a smaller rectangle 2220 having dimensions 2221 and 2222 from a larger rectangle 2210 having dimensions 2211 and 2212. In this example rectangle 2220 is a 9 by 13 rectangle of 64-bit values and rectangle 2210 is a larger 11 by 19 rectangle. The following stream parameters define this stream:

ICNT0=9
ELEM_BYTES=8
ICNT1=13
DIM1=88 (11 times 8)

Thus the iteration count in the 0 dimension 2221 is 9. The iteration count in the 1 direction 2222 is 13. Note that the ELEM_BYTES only scales the innermost dimension. The first dimension has ICNT0 elements of size ELEM_BYTES. The stream address generator does not scale the outer dimensions. Therefore, DIM1=88, which is 11 elements scaled by 8 bytes per element.

Figure 23:
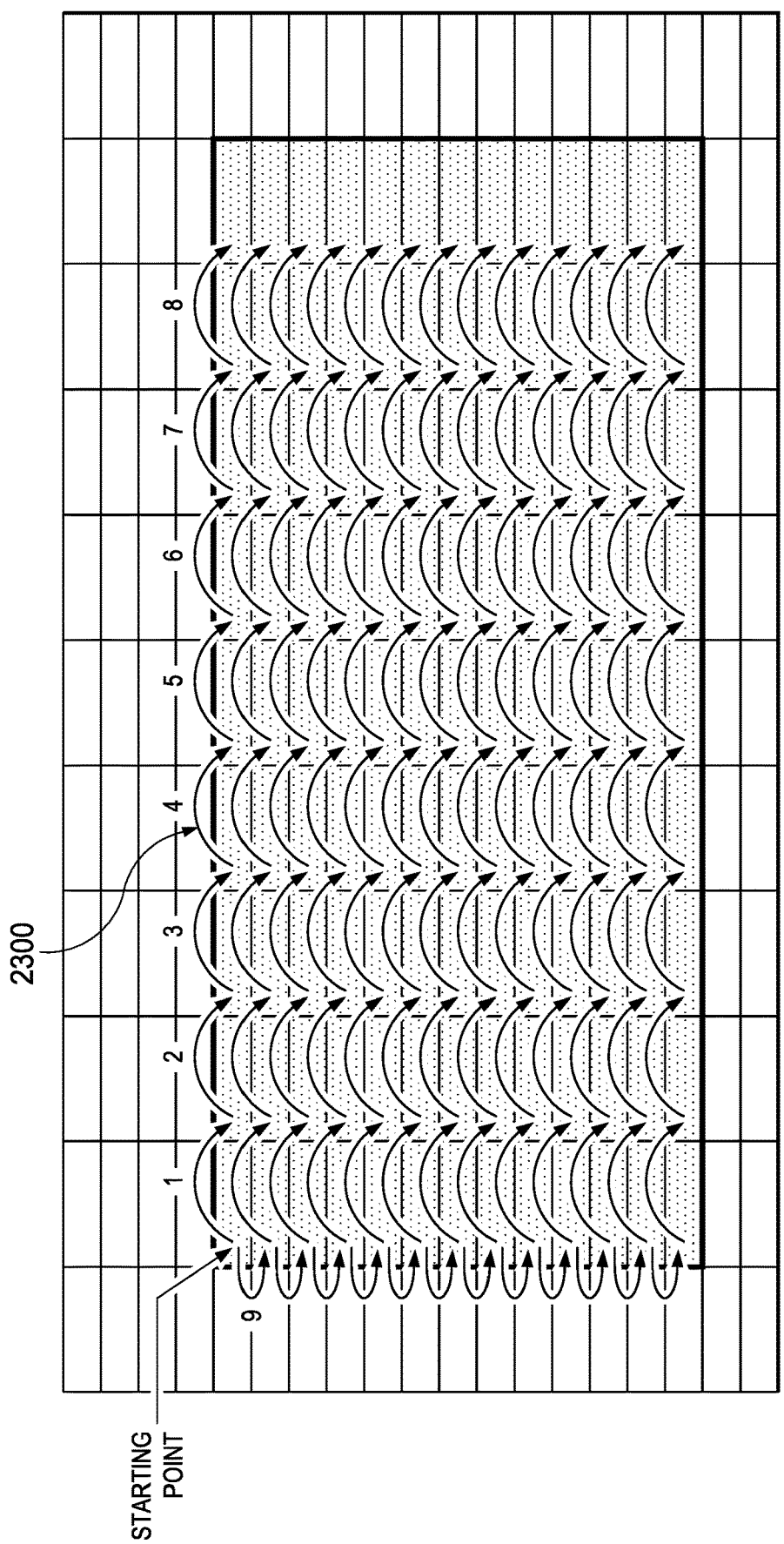
FIG. 23 illustrates the order of elements within the example stream of FIG. 21.

FIG. 23 illustrates the order of elements within this example stream. The streaming engine fetches elements for the stream in the order illustrated in order 2300. The first 9 elements come from the first row of rectangle 2220, left-to-right in hops 1 to 8. The 10th through 24th elements comes from the second row, and so on. When the stream moves from the 9th element to the 10th element (hop 9 in FIG. 23), the streaming engine computes the new location based on the pointer's position at the start of the inner loop, not where the pointer ended up at the end of the first dimension. This makes DIM1 independent of ELEM_BYTES and ICNT0. DIM1 always represents the distance between the first bytes of each consecutive row.

Figure 24:
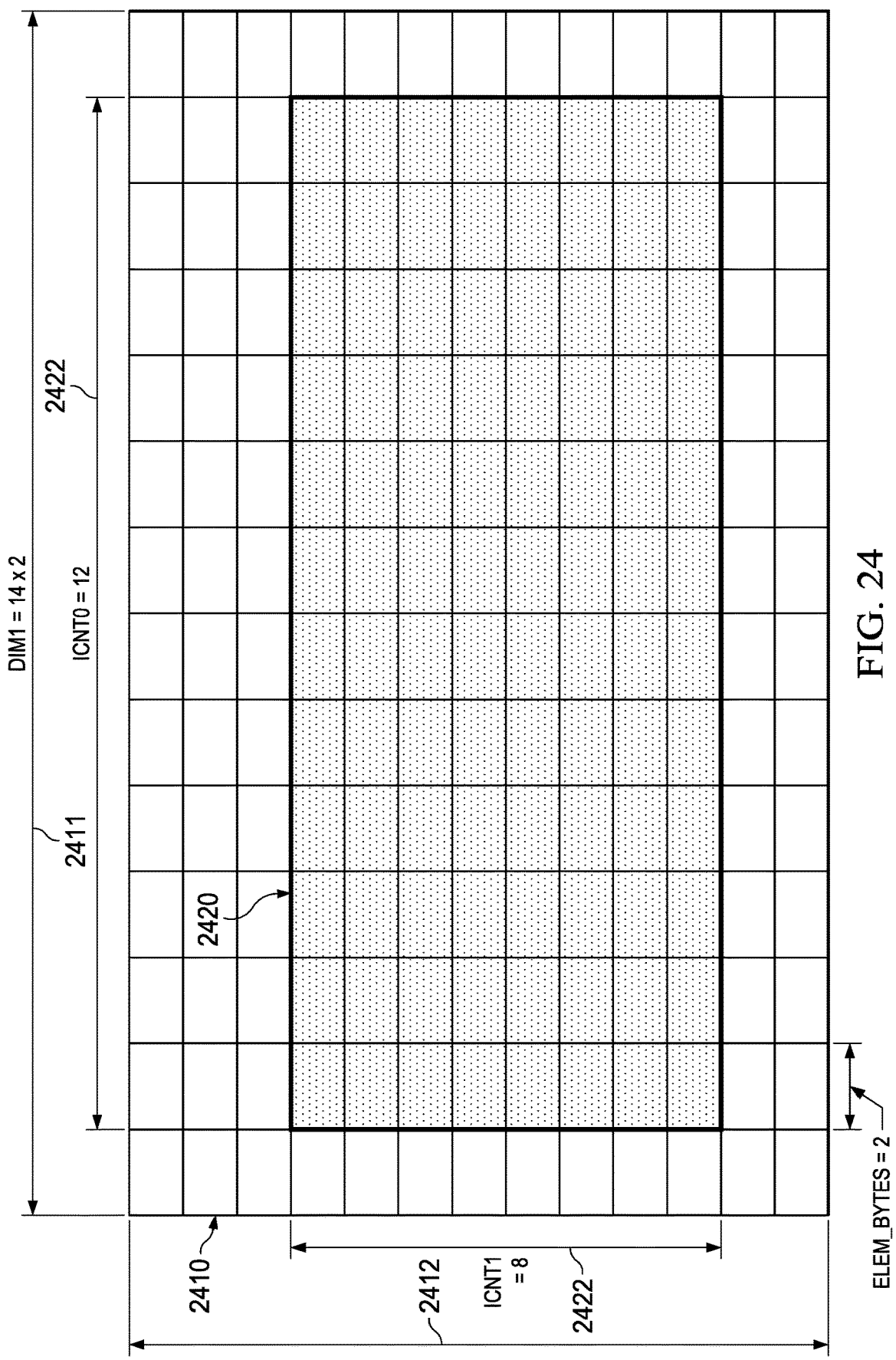
FIG. 24 illustrates extracting a smaller rectangle from a larger rectangle.

Transposed streams access along dimension 1 before dimension 0. The following examples illustrate a couple transposed streams, varying the transposition granularity. FIG. 24 illustrates extracting a smaller rectangle 2420 (12x8) having dimensions 2421 and 2422 from a larger rectangle 2410 (14×13) having dimensions 2411 and 2412. In FIG. 24 ELEM_BYTES equals 2.

Figure 25:
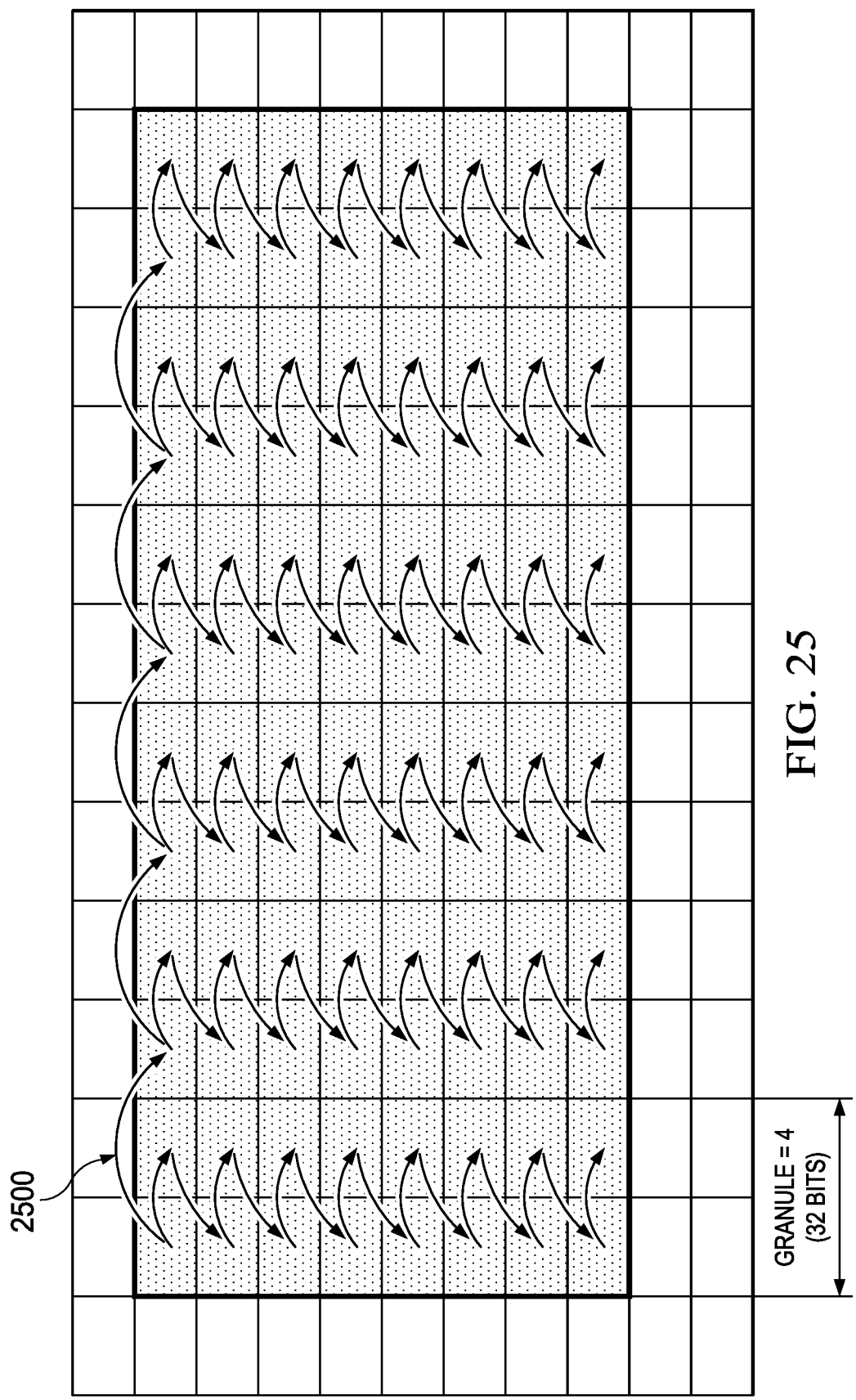
FIG. 25 illustrates how the streaming engine would fetch the stream of this example with a transposition granularity of 4 bytes.

FIG. 25 illustrates how the streaming engine would fetch the stream of this example with a transposition granularity of 4 bytes. Fetch pattern 2500 fetches pairs of elements from each row (because the granularity of 4 is twice the ELEM_BYTES of 2), but otherwise moves down the columns. Once it reaches the bottom of a pair of columns, it repeats this pattern with the next pair of columns.

Figure 26:
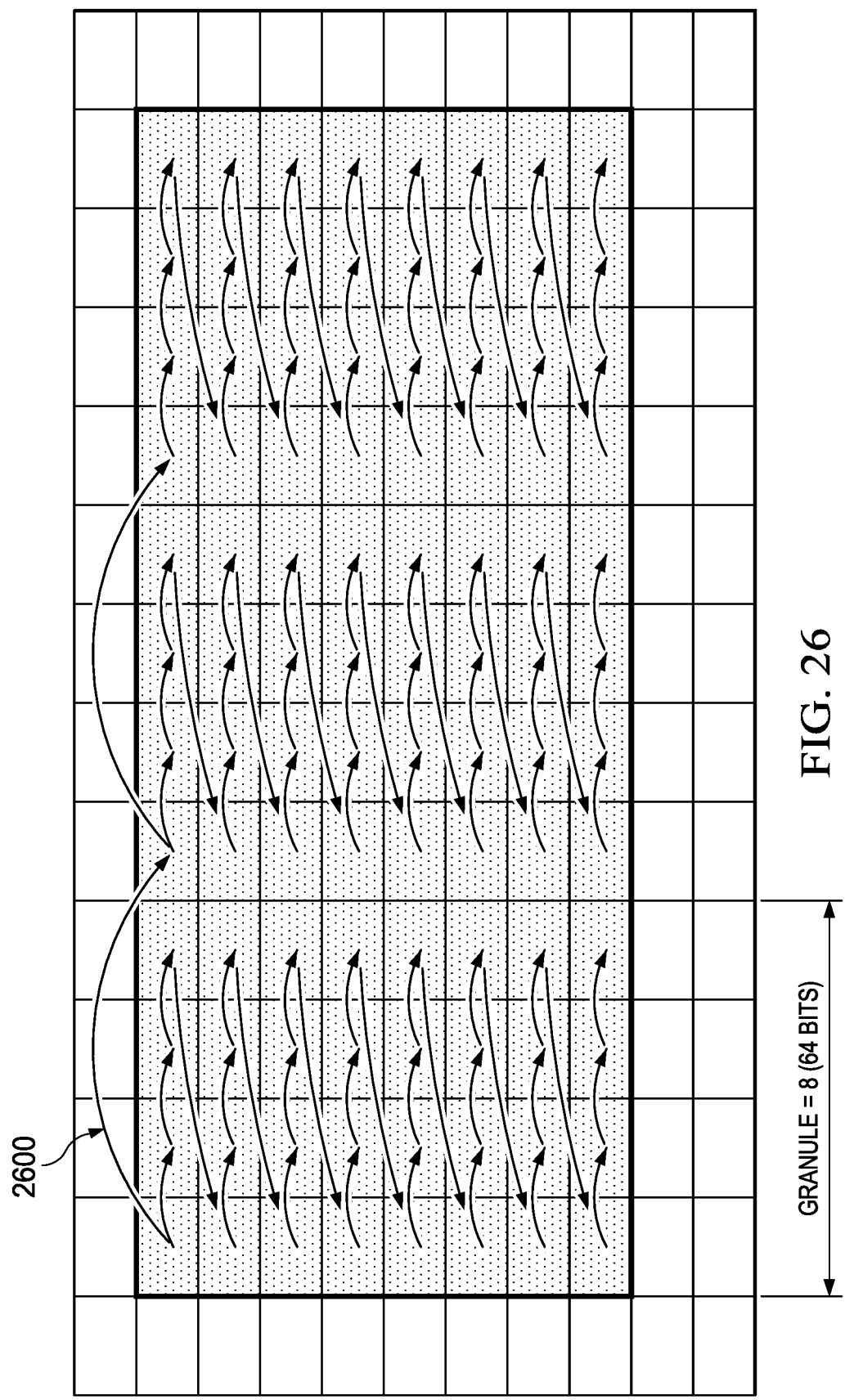
FIG. 26 illustrates how the streaming engine would fetch the stream of this example with a transposition granularity of 8 bytes.

FIG. 26 illustrates how the streaming engine would fetch the stream of this example with a transposition granularity of 8 bytes. The overall structure remains the same. The streaming engine fetches 4 elements from each row (because the granularity of 8 is four times the ELEM_BYTES of 2) before moving to the next row in the column as shown in fetch pattern 2600.

The streams examined so far read each element from memory exactly once. A stream can read a given element from memory multiple times, in effect looping over a piece of memory. FIR filters exhibit two common looping patterns. FIRs re-read the same filter taps for each output. FIRs also read input samples from a sliding window. Two consecutive outputs will need inputs from two overlapping windows.

Figure 27:
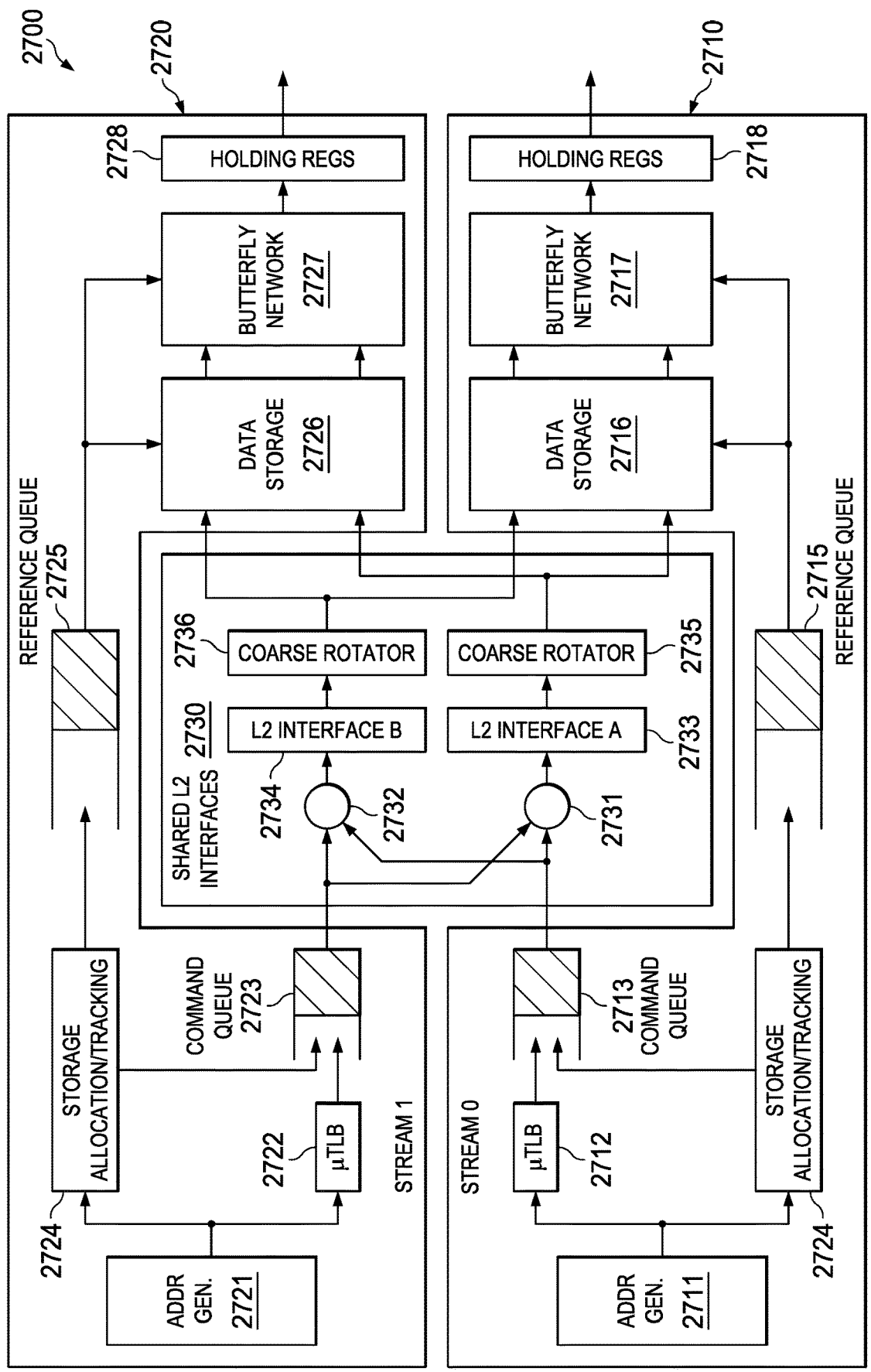
FIG. 27 illustrates the details of a streaming engine of this invention.

FIG. 27 illustrates the details of streaming engine 2700. Streaming engine 2700 contains three major sections: Stream 0 2710; Stream 1 2720; and Shared L2 Interfaces 2730. Stream 0 2710 and Stream 1 2720 both contain identical hardware that operates in parallel. Stream 0 2710 and Stream 1 2720 both share L2 interfaces 2730. Each stream 2710 and 2720 provides central processing unit core 110 with up to 512 bits/cycle, every cycle. The streaming engine architecture enables this through its dedicated stream paths and shared dual L2 interfaces.

Each streaming engine 2700 includes a dedicated 4-dimensional stream address generator 2711/2721 that can each generate two new non-aligned requests per cycle. Address generators 2711/2721 output 512-bit aligned addresses that overlap the elements in the sequence defined by the stream parameters. This will be further described below.

Figure 28:
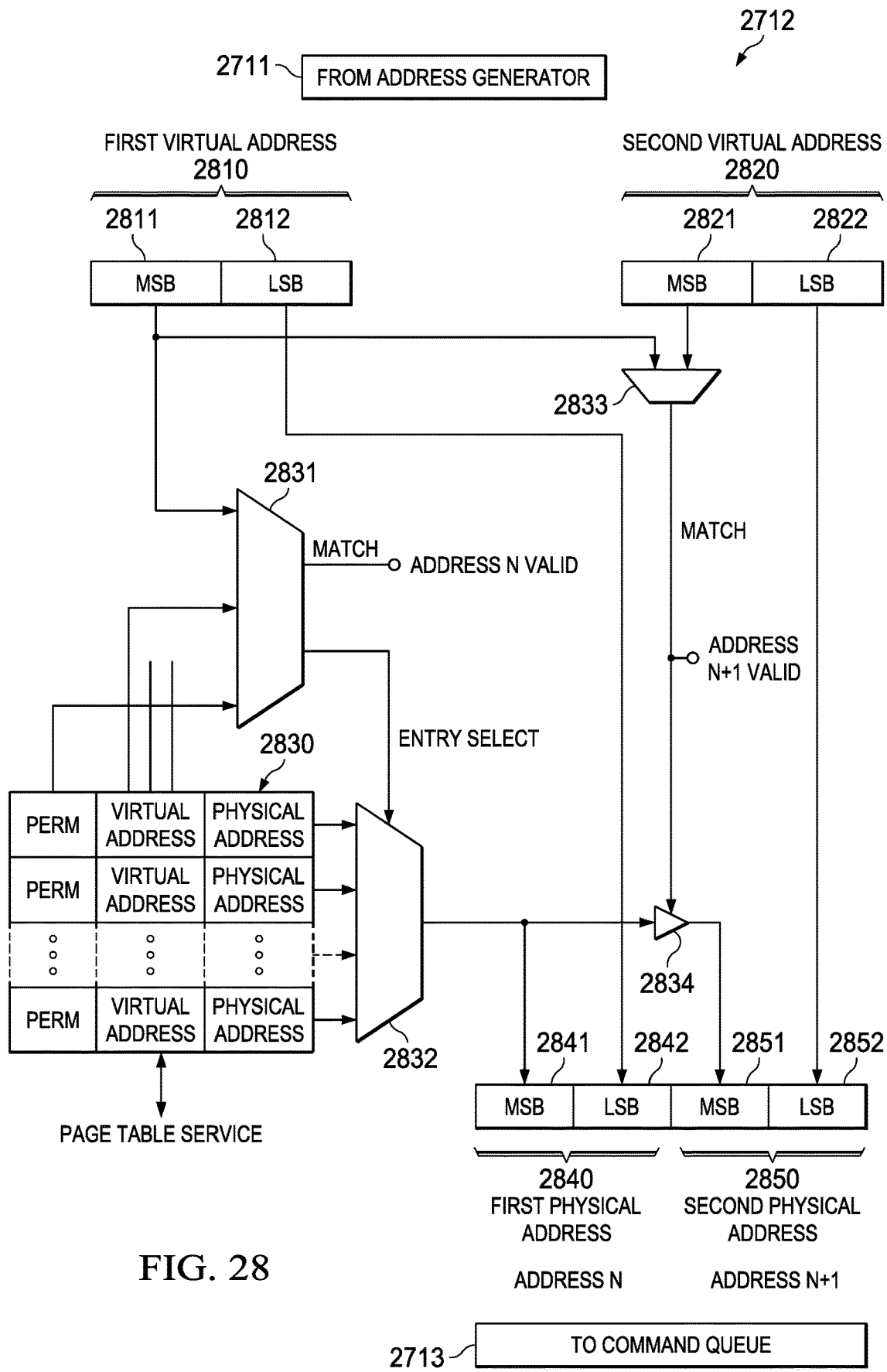
FIG. 28 illustrates further details of an exemplary micro table look-aside buffer (µTLB) of this invention.

Each address generator 2711/2711 connects to a dedicated micro table look-aside buffer µTLB) 2712/2722. FIG. 28 illustrates further details of an exemplary micro table look-aside buffer µTLB) 2712. Micro table look-aside buffer µTLB) 2722 of stream 1 is similarly constructed. The µTLB 2712 converts up to two 48-bit virtual addresses to 44-bit physical addresses each cycle. The µTLB 2712 of the preferred embodiment has 8 entries, covering a minimum of 32 kB with 4 kB pages or a maximum of 16 MB with 2 MB pages. As shown at address translation table 2830 illustrated in FIG. 28 each µTLB 2712 entry includes three parts. The first part is a set of permission bits. Permission bits indicate whether the page is readable or writable, cacheable, the type of memory (Normal or Device) and whether the page is secure or non-secure. Streaming engine 2700 requires stream data it fetches to be access readable, Normal memory with page security compatible with a current privilege execution mode (CPRIV) of central processing unit core 110. Streaming engine 2700 drops requests for pages that do not meet this criteria. A second set of µTLB entry bits are a first predetermined number of bits in of a virtual address. The final set of µTLB entry bits is a set of a second predetermined number of bits of a corresponding physical address.

Address translation takes place generally as follows. The µTLB 2712 compares a first predetermined plurality of most significant address bits 2811 of an address 2810 from address generator 2711 with the virtual address bits in each entry in the address translation table 2830. A match is only detected if the corresponding permission bits indicate readable, Normal memory with appropriate security. Upon detection of a match, µTLB 2712 substitutes the corresponding physical bits of the matching entry for the most significant address bits 2811 of address 2810 from the address generator 2711. The least significant bits of the generated address 2812 of address 2810 are passed unchanged. This constitutes the translated physical address 2840 having most significant bits 2841 equal to the physical address bits of the matching table 283 entry and the least significant bits 284 equal to the least significant bits 2812 of virtual address 2810.

If virtual address 2810 does not match the virtual address of one of the entries of address translation table 2830 (called a page miss), then streaming engine 2700 requests the appropriate entry from another memory. This would typically involve an external memory storing all page entries and may involve intermediate table look-aside buffers (TLB) storing a limited set of entries in a cache like fashion. Once the requested address translation entry is returned, µTLB 2712 generates the translated address as described above.

Each address generator 2711/2721 generates two addresses per cycle. A µTLB typically only translates one address per cycle. To maintain throughput, streaming engine 2700 takes advantage of the fact that most stream references will be within the same table entry. Address translation does not modify the least significant bits of the virtual address. If first virtual address 2810 and second virtual address 2820 are in the same address translation table 2830 entry, then the µTLB 2712 only translates first virtual address 2810 and reuses the physical bits of that entry for both virtual addresses.

FIG. 28 illustrates further details of an exemplary micro table look-aside buffer µTLB) 2712. The µTLB 2712 receives first virtual address 2810 and second virtual address 2820 from address generator 2711. Address generator 2711 sequentially generates addresses of data elements according to the defined data stream. Comparator 2831 compares the most significant bits 2811 with the virtual address bits of each entry in address translation table 2830. Comparator 2831 also checks the permission bits for the proper permissions (readable, Normal memory and security matching the CPRIV). If comparator 2831 detects a match it generates an address N valid signal indicating that translated address N (2840) is valid. Command queue 2713 stores a translated address N only if this valid signal indicates address N is valid. A match detected by comparator 2831 also generates an entry select signal indicating the matching entry. Multiplexer 2832 is controlled by the Select signal to select the physical address bits of the matching entry. First physical address 2840 consists of most significant bits 2841 of the matching entry from address translation table 2830 selected by multiplexer 2832 and least significant bits 2842 equal to least significant bits 2811 of first virtual address 2810.

The µTLB 2712 may make a second address translation under proper conditions. Comparator 2833 compares most significant bits 2811 and most significant bits 2821 of second virtual address 2820. If comparator 2833 detects a match it generates an address N+1 valid signal indicating that translated address N+1 (2850) is valid. Command queue 2713 stores a translated address N+1 only if this valid signal indicates address N+1 is valid. The match signal controls gate 2834 to supply the physical address bits selected by multiplexer 2832 to most significant bits 2851 of second physical address 2850. Least significant bits 2852 of second physical address 2850 are the same as least significant bits 2822. If comparator 2833 does not detect a match, then no second physical address is formed. Translated addresses are queued in command queue 2713, where they get aligned with information from Storage Allocation and Tracking block 2714.

Figure 29:
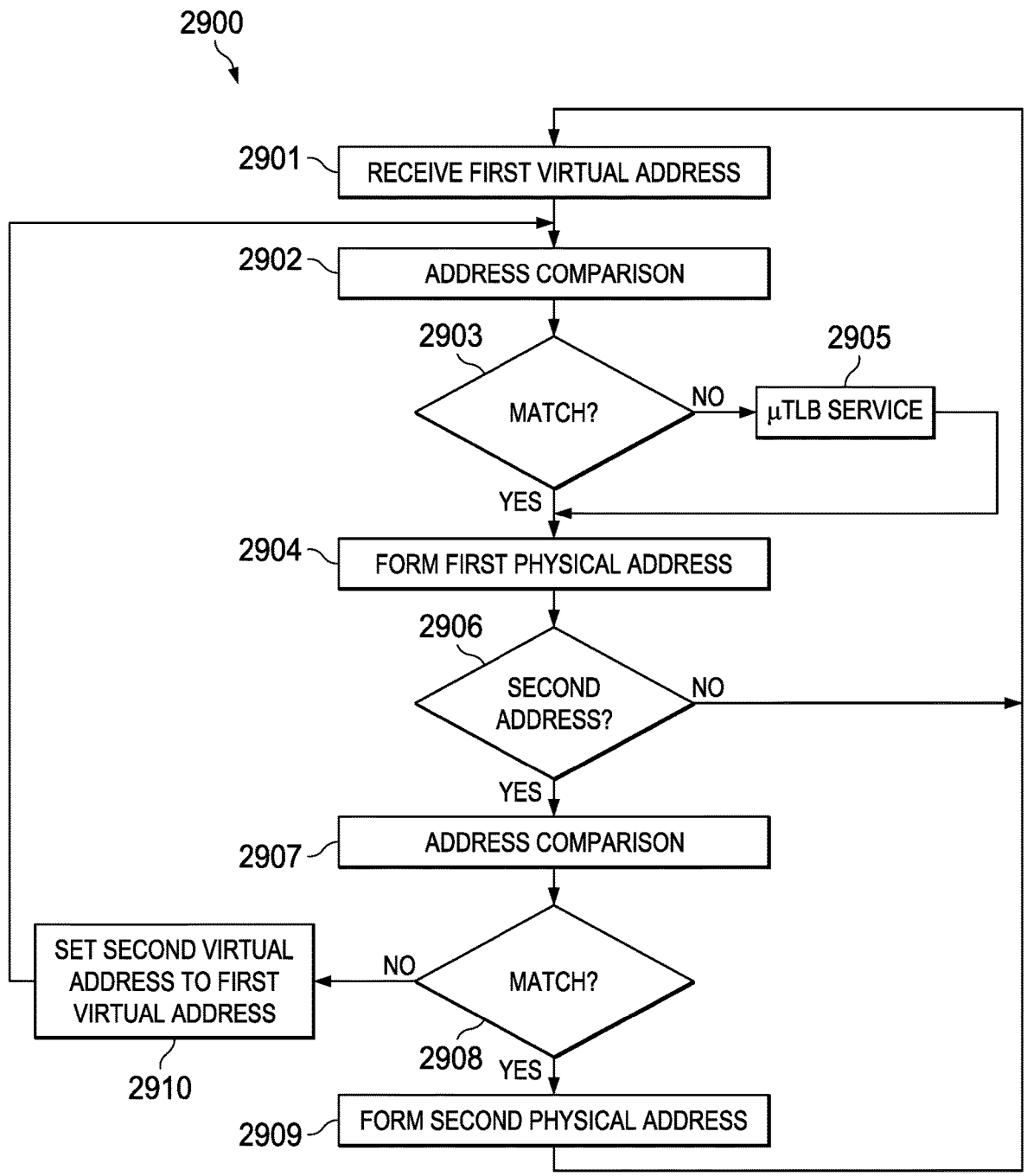
FIG. 29 is a flow chart illustrating the address translation process.

FIG. 29 illustrates process 2900 of this address translation process. Process 2900 operates continuously beginning upon each receipt of a new first virtual address 2901. Process 2900 then makes the address compare 2902. As described above most significant bits 2811 are compared with the virtual address bits of each entry of address translation table 2830 along with the corresponding appropriate permissions.

Test block 2903 branches based upon the results of the address comparison. If a match is found (Yes at test block 2903), then block 2904 forms the first physical address. This substitutes the physical address from the matching entry in address translation table 2830 for the most significant bits 2811 of first virtual address 2810. If no match is found (No at test block 2903), then µTLB 2712 requests the corresponding page translation entry from another memory. This would typically involve an external memory storing all page entries and may involve intermediate table look-aside buffers (TLB) storing a limited set of entries in a cache like fashion. Once the requested address translation entry is returned, process 2900 proceeds to block 2904 to form the translated address.

Test block 2906 determines if a second virtual address is received. As disclosed above a second virtual address may be translated if the most significant bits match the corresponding bits of the first virtual address. Block 2907 make the determining address comparison. Test block 2908 determines if the conditions are met. If so (Yes at test block 2908), then block 2909 forms the second physical address. This is done by substituting the physical address bits of the matching table entry for the most significant bits 2821 of the second virtual address 2820. Process 2900 repeats by return to block 2901.

If the conditions for forming a second address translation are not met (No at test block 2908), then block 2910 sets the second virtual address as the first virtual address. Process 2900 returns to block 2902 for the address comparison. Flow proceeds as described.

Translated addresses are queued in command queue 2713/2723. These addresses are aligned with information from the corresponding Storage Allocation and Tracking block 2714/2724. Streaming engine 2700 does not explicitly manage µTLB 2712/2722. The system memory management unit (MMU) invalidates µTLBs as necessary during context switches.

The two streams 2710/2720 share a pair of independent L2 interfaces 2730: L2 Interface A (IFA) 2733 and L2 Interface B (IFB) 2734. Each L2 interface provides 512 bits/cycle throughput direct to the L2 controller for an aggregate bandwidth of 1024 bits/cycle. The L2 interfaces use the credit-based multicore bus architecture (MBA) protocol. The L2 controller assigns each interface its own pool of command credits. The pool should have sufficient credits so that each interface can send sufficient requests to achieve full read-return bandwidth when reading L2 RAM, L2 cache and multicore shared memory controller (MSMC) memory.

To maximize performance, both streams can use both L2 interfaces, allowing a single stream to send a peak command rate of 2 requests/cycle. Each interface prefers one stream over the other, but this preference changes dynamically from request to request. IFA 2733 and IFB 2734 always prefer opposite streams, when IFA 2733 prefers Stream 0, IFB 2734 prefers Stream 1 and vice versa.

Figure 30:
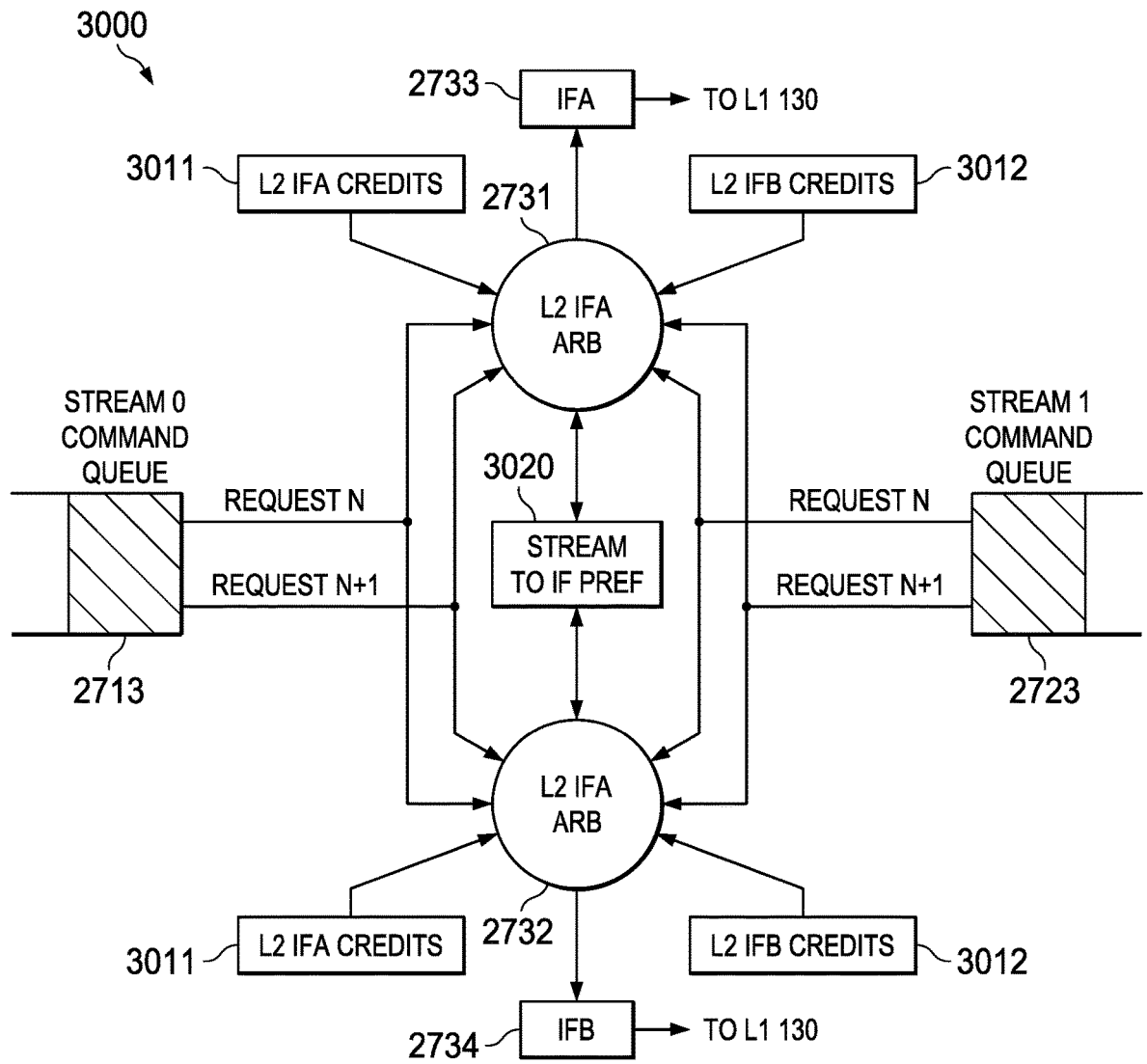
FIG. 30 illustrates details of an interface between two arbiters and two ports to level two combined instruction/data cache of this invention.

FIG. 30 illustrates details of the interface between arbiters 2731/2732 and the ports to level two combined instruction/data cache 130, IFA 2733 and IFB 2734. Stream 0 command queue 2713 stores a sequence of translated address for stream 0. Stream 0 command queue 2713 supplies the next sequential address (designated request N) to both arbitrators 2732 and 2734. Stream 0 command queue 2713 also supplies a following sequential address (designated request N+1) to both arbiters 2732 and 2734. Stream 1 command queue 2723 stores a sequence of translated address for stream 2. Stream 1 command queue 2723 supplies request N and request N+1 to both arbiters 2732 and 2734. Arbiters 2732 and 2734 receive the LFA credits from LFA credit 3011 and LFB credits from LFB credits 3012. These are duplicated in FIG. 30 for clarity. Arbiters 2732 and 2734 are each connected to stream to IF preference block 3020. Stream to IF preference block 3020 controls the stream to L2 port preference ensuring opposite preference for the two interfaces. Arbiter 2713 selects an address (request N or request N+1 from stream 0 command queue 2713 or request N or request N+1 from stream 1 command queue 2723) for supply to combined instruction/data cache 130 via its port IFA 2733. Arbiter 2723 selects from among the same four addresses for supply to combined instruction/data cache 130 via its port IFA 2734.

Figure 31:
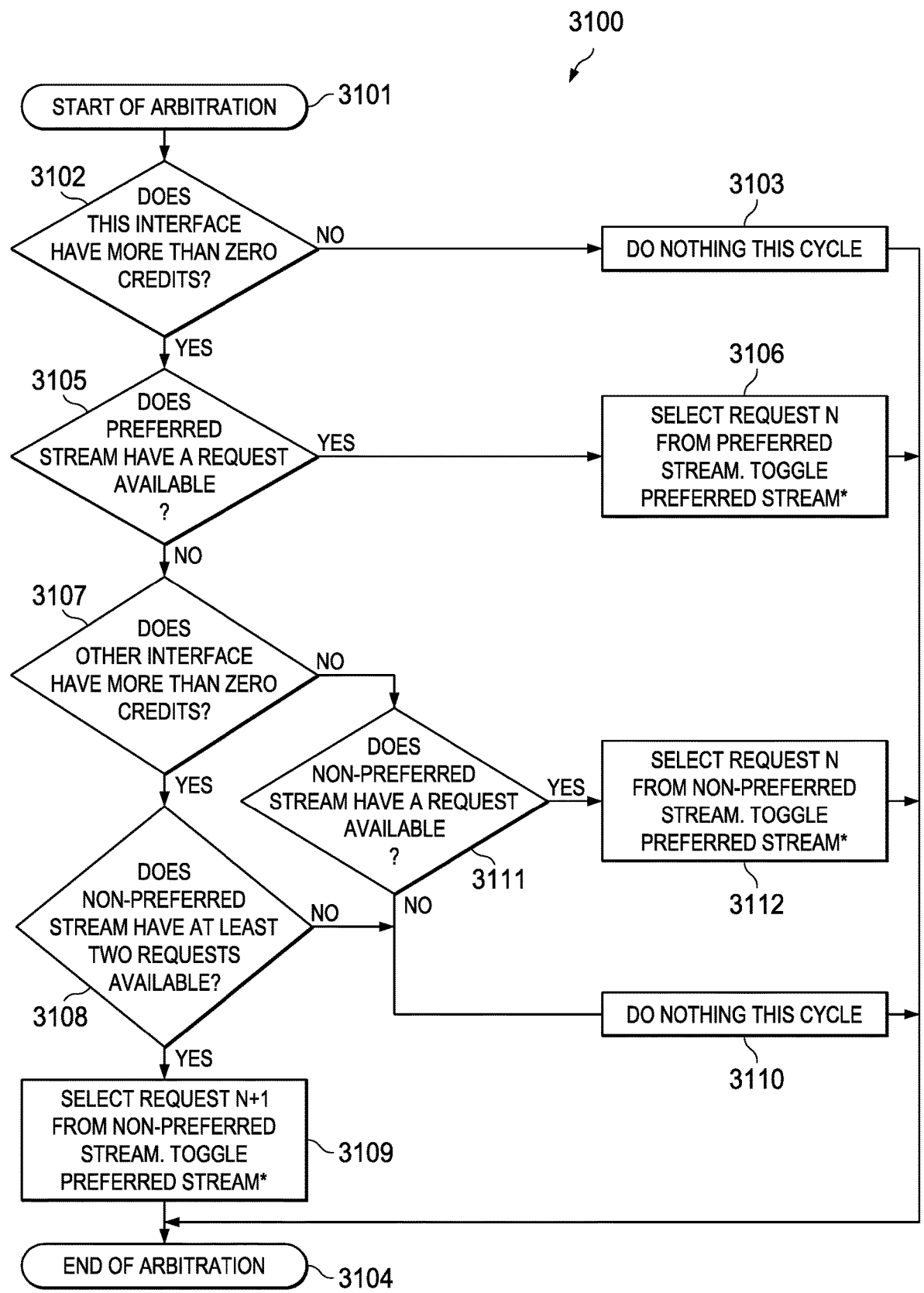
FIG. 31 is a flow chart illustrating a process used by both arbiters for selection of one of the four supplied addresses for the corresponding memory port.

FIG. 31 illustrates process 3100 used by both arbiters 2713 and 2723 for selection of one of the four supplied addresses. Note that process 3100 operates in independently and in parallel on arbiters 2713 and 2723. Each arbiter 2731/2732 applies this protocol on every cycle it has credits available. A credit indicates that the memory (level two combined instruction/data cache 130 in the preferred embodiment) can service a memory request from that memory interface. This invention assumes that a memory interface can hold plural credits, meaning that the memory can service plural assess requests simultaneously submitted by that memory interface up to the number of credits. Credits are handled independently for the two memory interfaces.

Arbitration begins at start block 3101. In test block 3102, the arbiter determines if the corresponding interface has non-zero credits. If the arbiter has no credits (No at test block 3102), then process 3100 does nothing for this cycle (block 3103). Arbitration for that cycle ends at end block 3104.

If the arbiter has more than zero credits (Yes at test block 3102), then test block 3105 determines whether the preferred stream has a command ready to send. If so (Yes at test block 3105), then block 3106 chooses the first such command (request N). Block 3106 also signals stream to IF preference block 3020 to toggle the stream to L2 port preference. This selected command is submitted to the corresponding shared L2 interface 2733 or 2734. This commands level two combined instruction/data cache 130 to recall data at that address (on a L2 cache hit) or request cache service from another memory (on a L2 cache miss). In either case the ultimate result is return of the requested data for the corresponding stream. Arbitration ends for that cycle at end block 3104.

If the preferred stream does not have a command ready (No at test block 3105), then test block 3107 determines if the other interface has non-zero credits. If the other interface has non-zero credits (Yes at test block 3107), then test block 3108 determines if the non-preferred stream has at least two requests ready to send. If so (Yes at test block 3108), block 3110 selects request N+1 from the alternate stream for submission to the corresponding shared L2 interface 2733 or 2734. Note this situation presumes the other arbiter and interface selects request N from the alternate stream for submission. Block 3108 also signals stream to IF preference block 3020 to toggle the stream to L2 port preference. Arbitration ends for that cycle at end block 3104. If the non-preferred stream does not have at least two requests ready to send (No at test block 3108), then process 3100 does nothing for this cycle (block 3110). Arbitration for that cycle ends at end block 3104.

If the other interface has zero credits (No at test block 3107), then test block 3111 determines if the non-preferred stream has a request ready to send. If not (No at test block 3111), then arbitration ends for that cycle at end block 3104. If the non-preferred stream has a request ready to send (Yes at test block 3111), then block 3112 selects request N from the non-preferred stream for submission to the corresponding shared L2 interface 2733 or 2734 and signals stream to IF preference block 3020 to toggle the stream to L2 port preference. Arbitration ends for that cycle at end block 3104.

This simple algorithm dispatches requests as quickly as possible while retaining fairness between the two streams. The stream preference rule ensures that each stream can send a request on every cycle that has available credits. This mechanism permits one stream to borrow the other's interface when the other interface is idle. This spreads the bandwidth demand for each stream across both interfaces, ensuring neither interface becomes a bottleneck.

Storage Allocation and Tracking 2714/2724 manages the stream's internal storage, discovering data reuse and tracking the lifetime of each piece of data. This will be further described below.

Reference queue 2715/2725 stores the sequence of references generated by the corresponding address generator 2711/2721. This information drives the data formatting network so that it can present data to central processing unit core 110 in the correct order. Each entry in reference queue 2715/2725 contains the information necessary to read data out of the data store and align it for central processing unit core 110. Reference queue 2715/2725 maintains the following information listed in Table 5 in each slot:

TABLE 5

| Data Slot Low | Slot number for the lower half of data associated with aout0 |
| Data Slot High | Slot number for the upper half of data associated with aout1 |
| Rotation | Number of bytes to rotate data to align next element with lane 0 |
| Length | Number of valid bytes in this reference |

Storage allocation and tracking 2714/2724 inserts references in reference queue 2715/2725 as address generator 2711/2721 generates new addresses. Storage allocation and tracking 2714/2724 removes references from reference queue 2715/2725 when the data becomes available and there is room in the stream holding registers. As storage allocation and tracking 2714/2724 removes slot references from reference queue 2715/2725 and formats data, it checks whether the references represent the last reference to the corresponding slots. Storage allocation and tracking 2714/2724 compares reference queue 2715/2725 removal pointer against the slot's recorded Last Reference. If they match, then storage allocation and tracking 2714/2724 marks the slot inactive once it's done with the data.

Streaming engine 2700 has data storage 2716/2737 for an arbitrary number of elements. Deep buffering allows the streaming engine to fetch far ahead in the stream, hiding memory system latency. The right amount of buffering might vary from product generation to generation. In the current preferred embodiment streaming engine 2700 dedicates 32 slots to each stream. Each slot holds 64 bytes of data.

Butterfly network 2717/2727 consists of a 7 stage butterfly network. Butterfly network 2717/2727 receives 128 bytes of input and generates 64 bytes of output. The first stage of the butterfly is actually a half-stage. It collects bytes from both slots that match a non-aligned fetch and merges them into a single, rotated 64-byte array. The remaining 6 stages form a standard butterfly network. Butterfly network 2717/2727 performs the following operations: rotates the next element down to byte lane 0; promotes data types by one power of 2, if requested; swaps real and imaginary components of complex numbers, if requested; converts big endian to little endian if central processing unit core 110 is presently in big endian mode. The user specifies element size, type promotion and real/imaginary swap as part of the stream's parameters.

Streaming engine 2700 attempts to fetch and format data ahead of the demand for it by central processing unit core 110, so that central processing unit core 110 can maintain full throughput. Holding registers 2718/2728 provide a small amount of buffering so that the process remains fully pipelined. Holding registers 2718/2728 are not directly architecturally visible, except for the fact that streaming engine 2700 provides full throughput.

Coarse Grain Rotator 2735/2736 enables streaming engine 2700 to support a transposed matrix addressing mode. In this mode, streaming engine 2700 interchanges the two innermost dimensions of its multidimensional loop. This accesses an array column-wise rather than row-wise. Rotator 2735/2736 is not architecturally visible, except as enabling this transposed access mode.

Figure 32:
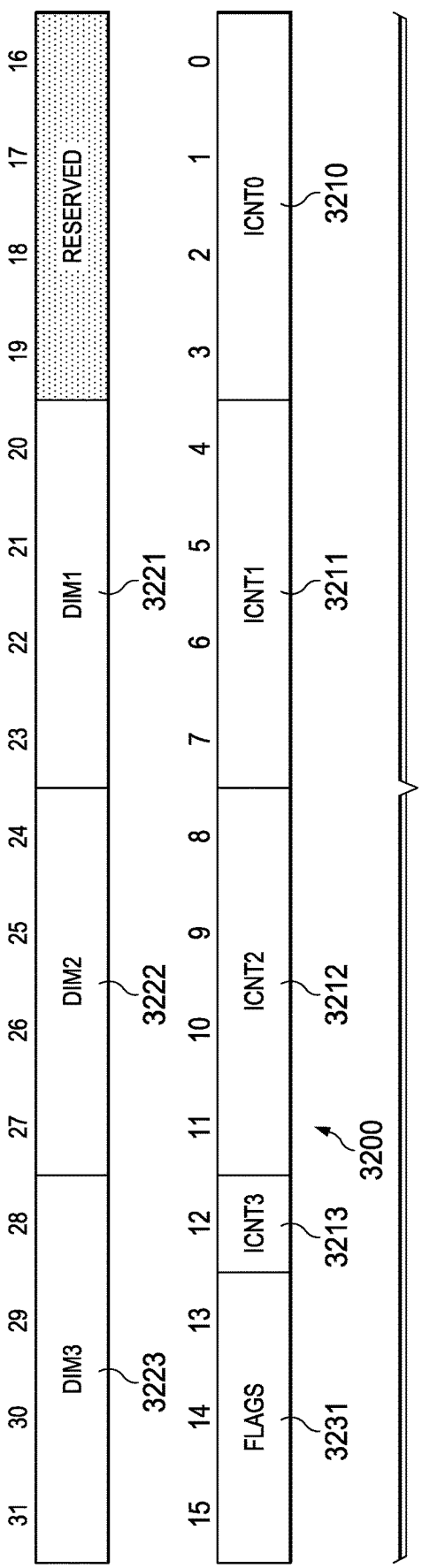
FIG. 32 illustrates a stream template register of this invention.

The stream definition template provides the full structure of a stream that contains data. The iteration counts and dimensions provide most of the structure, while the various flags provide the rest of the details. For all data-containing streams, the streaming engine defines a single stream template. All stream types it supports fit this template. The numbers above each field indicate byte numbers within a 256-bit vector. The streaming engine defines a four-level loop nest for addressing elements within the stream. Most of the fields in the stream template map directly to the parameters in that algorithm. FIG. 32 illustrates stream template register 3200. Stream template register 3200 includes fields: ICNT0 3210; INCT1 3211; INCT2 3212; INCT3 3213; DIM1 3221; DIM2 3222; DIM 3223; and Flags 3231. The numbers above the fields are byte numbers within a 512-bit vector. Table 6 shows the stream field definitions of a stream template.

TABLE 6

| Field Name | Description | Size Bits |
|---|---|---|
| ICNT0 | Iteration count for loop 0 (innermost) | 32 |
| ICNT1 | Iteration count for loop 1 | 32 |
| ICNT2 | Iteration count for loop 2 | 32 |
| ICNT3 | Iteration count for loop 3 (outermost) | 8 |
| DIM1 | Signed dimension for loop 1 | 32 |
| DIM2 | Signed dimension for loop 2 | 32 |
| DIM3 | Signed dimension for loop 3 | 32 |
| FLAGS | Stream modifier flags | 24 |

In the current example DIM0 is always equal to is ELEM_BYTES defining physically contiguous data. The stream template includes mostly 32-bit fields. The stream template limits ICNT3 to 8 bits and the FLAGS field to 24 bits. Streaming engine 2700 interprets all iteration counts as unsigned integers and all dimensions as unscaled signed integers. The template above fully specifies the type of elements, length and dimensions of the stream. The stream instructions separately specify a start address. This would typically be by specification of a scalar register in scalar register file 211 which stores this start address. This allows a program to open multiple streams using the same template.

Figure 33:
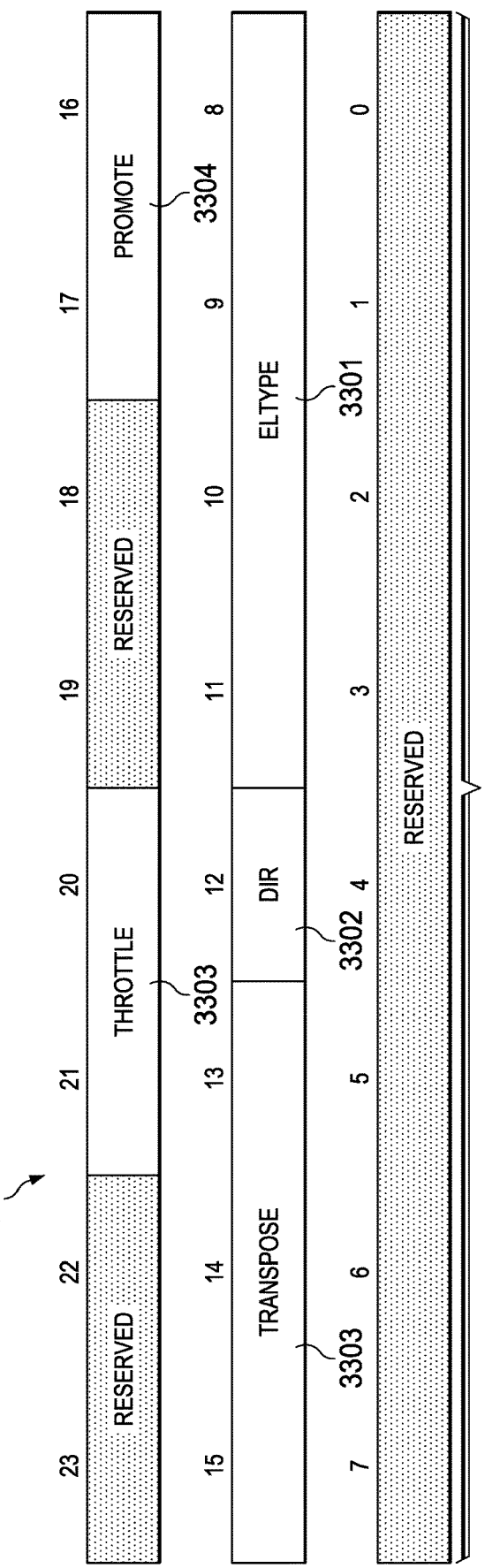
FIG. 33 illustrates sub-field definitions of the flags field of the stream template register of this invention.

FIG. 33 illustrates sub-field definitions of the flags field 3231. As shown in FIG. 33 the flags field 3231 is 3 bytes or 24 bits. Flags field 3231 includes: ELTYOE field 3301; DIR field 3302; transpose field 3303; promote field 3304; and throttle field 3305. FIG. 33 shows bit numbers of the fields. Table 7 shows the definition of these fields.

TABLE 7

| Field Name | Description | Size Bits |
|---|---|---|
| ELTYPE | Type of data element | 4 |
| DIR | Stream direction<br>0 forward direction<br>1 reverse direction | 1 |
| TRANSPOSE | Two dimensional transpose mode | 3 |
| PROMOTE | Promotion mode | 2 |
| THROTTLE | Fetch ahead throttle mode | 2 |

The Element Type (ELTYPE) field 3301 defines the data type of the elements in the stream. The coding of the four bits of this field is defined as shown in Table 8.

TABLE 8

| ELTYPE | Sub-element Size Bits | Total Element Size Bits | Real - Complex | Bytes/Element |
|---|---|---|---|---|
| 0000 | 8 | 8 | real | 1 |
| 0001 | 16 | 16 | real | 2 |
| 0010 | 32 | 32 | real | 4 |
| 0011 | 64 | 64 | real | 8 |
| 0100 | | | reserved | |
| 0101 | | | reserved | |
| 0110 | | | reserved | |
| 0111 | | | reserved | |
| 1000 | 8 | 16 | complex no swap | 2 |
| 1001 | 16 | 32 | complex no swap | 4 |
| 1010 | 32 | 64 | complex no swap | 8 |
| 1011 | 64 | 128 | complex no swap | 16 |
| 1100 | 8 | 16 | complex swapped | 2 |
| 1101 | 16 | 32 | complex swapped | 4 |
| 1110 | 32 | 64 | complex swapped | 8 |
| 1111 | 64 | 128 | complex swapped | 16 |

Sub-Element Size determines the type for purposes of type promotion and vector lane width. For example, 16-bit sub-elements get promoted to 32-bit sub-elements when a stream requests type promotion. The vector lane width matters when central processing unit core 110 operates in big endian mode, as it always lays out vectors in little endian order.

Total Element Size determines the minimal granularity of the stream. In the stream addressing model, it determines the number of bytes the stream fetches for each iteration of the innermost loop. Streams always read whole elements, either in increasing or decreasing order. Therefore, the innermost dimension of a stream spans ICNT0×total-element-size bytes.

Real-Complex Type determines whether the streaming engine treats each element as a real number or two parts (real/imaginary or magnitude/angle) of a complex number. This field also specifies whether to swap the two parts of complex numbers. Complex types have a total element size that is twice their sub-element size. Otherwise, the sub-element size equals total element size.

The DIR bit 3302 determines the direction of fetch of the inner loop (Loop0). If the DIR bit 2902 is 0 then Loop0 fetches are in the forward direction toward increasing addresses. If the DIR bit 2902 is 1 then Loop0 fetches are in the backward direction toward decreasing addresses.

The TRANSPOSE field 3303 determines whether the streaming engine accesses the stream in a transposed order. The transposed order exchanges the inner two addressing levels. The TRANSPOSE field also indicated the granularity it transposes the stream. The coding of the four bits of this field is defined as shown in Table 9.

TABLE 9

| Transpose | Transpose Duplication | Granule Bytes | Stream Advance Rate |
|---|---|---|---|
| 0000 | both disabled | | 64 bytes |
| 0001 | | reserved | |
| 0010 | | reserved | |
| 0011 | transpose | 4 | 16 rows |
| 0100 | transpose | 8 | 8 rows |
| 0101 | transpose | 16 | 4 rows |
| 0110 | transpose | 32 | 2 rows |
| 0111 | | reserved | |
| 1000 | duplicate | 1 | 1 byte |
| 1001 | duplicate | 2 | 2 bytes |
| 1010 | duplicate | 4 | 4 bytes |
| 1011 | duplicate | 8 | 8 bytes |
| 1100 | duplicate | 16 | 16 bytes |
| 1101 | duplicate | 32 | 32 bytes |
| 1110 | | reserved | |
| 1111 | | reserved | |

Streaming engine 2700 actually transposes at a different granularity than the element size. This allows programs to fetch multiple columns of elements from each row. The transpose granularity must be no smaller than the element size.

The PROMOTE field 3304 controls whether the streaming engine promotes sub-elements in the stream and the type of promotion. When enabled, streaming engine 2700 promotes types by a single power-of-2 size. The coding of the two bits of this field is defined as shown in Table 10.

TABLE 10

| PROMOTE | Description |
|---|---|
| 00 | no promotion |
| 01 | unsigned integer promotion, zero extend |
| 10 | signed integer promotion, sign extend |
| 11 | floating point promotion |

When the stream specifies No promotion, each sub-element occupies a vector lane equal in width to the size specified by ELTYPE. Otherwise, each sub-element occupies a vector lane twice as large. When PROMOTE is 00, the streaming engine fetches half as much data from memory to satisfy the same number of stream fetches.

Promotion modes 01b and 10b treat the incoming sub-elements as unsigned and signed integers, respectively. For unsigned integers, the streaming engine promotes by filling the new bits with zeros. For signed integers the streaming engine promotes by filling the new bits with copies of the sign bit. Positive signed integers have a most significant bit equal to 0. On promotion of positive signed integers, the new bits are zero filled. Negative signed integers have a most significant bit equal to 1. On promotion of negative signed integers, the new bits are 1 filled.

Promotion mode 11b treats the incoming sub-elements as floating point numbers. Floating point promotion treats each sub-element as a floating point type. The streaming engine supports two floating point promotions: short float (16-bit) to single precision float (32-bit); and single precision float (32-bit) to double precision float (64-bit).

The THROTTLE field 3305 controls how aggressively the streaming engine fetches ahead of central processing unit core 110. The coding of the two bits of this field is defined as shown in Table 11.

TABLE 11

| THROTTLE | Description |
| --- | --- |
| 00 | Minimum throttling, maximum fetch ahead |
| 01 | Less throttling, more fetch ahead |
| 10 | More throttling, less fetch ahead |
| 11 | Maximum throttling, minimum fetch ahead |

THROTTLE does not change the meaning of the stream, and serves only as a hint. The streaming engine may ignore this field. Programs should not rely on the specific throttle behavior for program correctness, because the architecture does not specify the precise throttle behavior. THROTTLE allows programmers to provide hints to the hardware about the program's own behavior. By default, the streaming engine attempts to get as far ahead of central processing unit core 110 as it can to hide as much latency as possible, while providing full stream throughput to central processing unit core 110. While several key applications need this level of throughput, it can lead to bad system level behavior for others. For example, the streaming engine discards all fetched data across context switches. Therefore, aggressive fetch-ahead can lead to wasted bandwidth in a system with large numbers of context switches. Aggressive fetch-ahead only makes sense in those systems if central processing unit core 110 consumes data very quickly.

The central processing unit core 110 exposes the streaming engine to programs through a small number of instructions and specialized registers. A STROPEN instruction opens a stream. The STROPEN command specifies a stream number indicating opening stream 0 or stream 1. The STROPEN specifies a stream template register which stores the stream template as described above. The arguments of the STROPEN instruction are listed in Table 12.

TABLE 12

| Argument | Description |
| --- | --- |
| Stream Start Address Register | Scaler register storing stream start address |
| Steam Number | Stream 0 or Stream 1 |
| Stream Template Register | Vector register storing stream template data |

The stream start address register is preferably a scalar register in general scalar register file 211. The STROPEN instruction specifies stream 0 or stream 1 by its opcode. The stream template register is preferably a vector register in general vector register file 221. If the specified stream is active the STROPEN instruction closes the prior stream and replaces the stream with the specified stream.

A STRCLOSE instruction closes a stream. The STRCLOSE command specifies the stream number of the stream to be closed.

A STRSAVE instruction captures sufficient state information of a specified stream to restart that stream in the future. A STRRSTR instruction restores a previously saved stream. A STRSAVE instruction does not save any of the data of the stream. A STRSAVE instruction saves only metadata. The stream re-fetches data in response to a STRRSTR instruction.

Streaming engine is in one of three states: Inactive; Active; or Frozen. When inactive the streaming engine does nothing. Any attempt to fetch data from an inactive streaming engine is an error. Until the program opens a stream, the streaming engine is inactive. After the program consumes all the elements in the stream or the program closes the stream, the streaming engine also becomes inactive. Programs which use streams explicitly activate and inactivate the streaming engine. The operating environment manages streams across context-switch boundaries via the streaming engine's implicit freeze behavior, coupled with its own explicit save and restore actions.

Active streaming engines have a stream associated with them. Programs can fetch new stream elements from active streaming engines. Streaming engines remain active until one of the following. When the stream fetches the last element from the stream, it becomes inactive. When program explicitly closes the stream, it becomes inactive. When central processing unit core 110 responds to an interrupt or exception, the streaming engine freezes. Frozen streaming engines capture all the state necessary to resume the stream where it was when the streaming engine froze. The streaming engines freeze in response to interrupts and exceptions. This combines with special instructions to save and restore the frozen stream context, so that operating environments can cleanly switch contexts. Frozen streams reactivate when central processing unit core 110 returns to the interrupted context.

Figure 34:
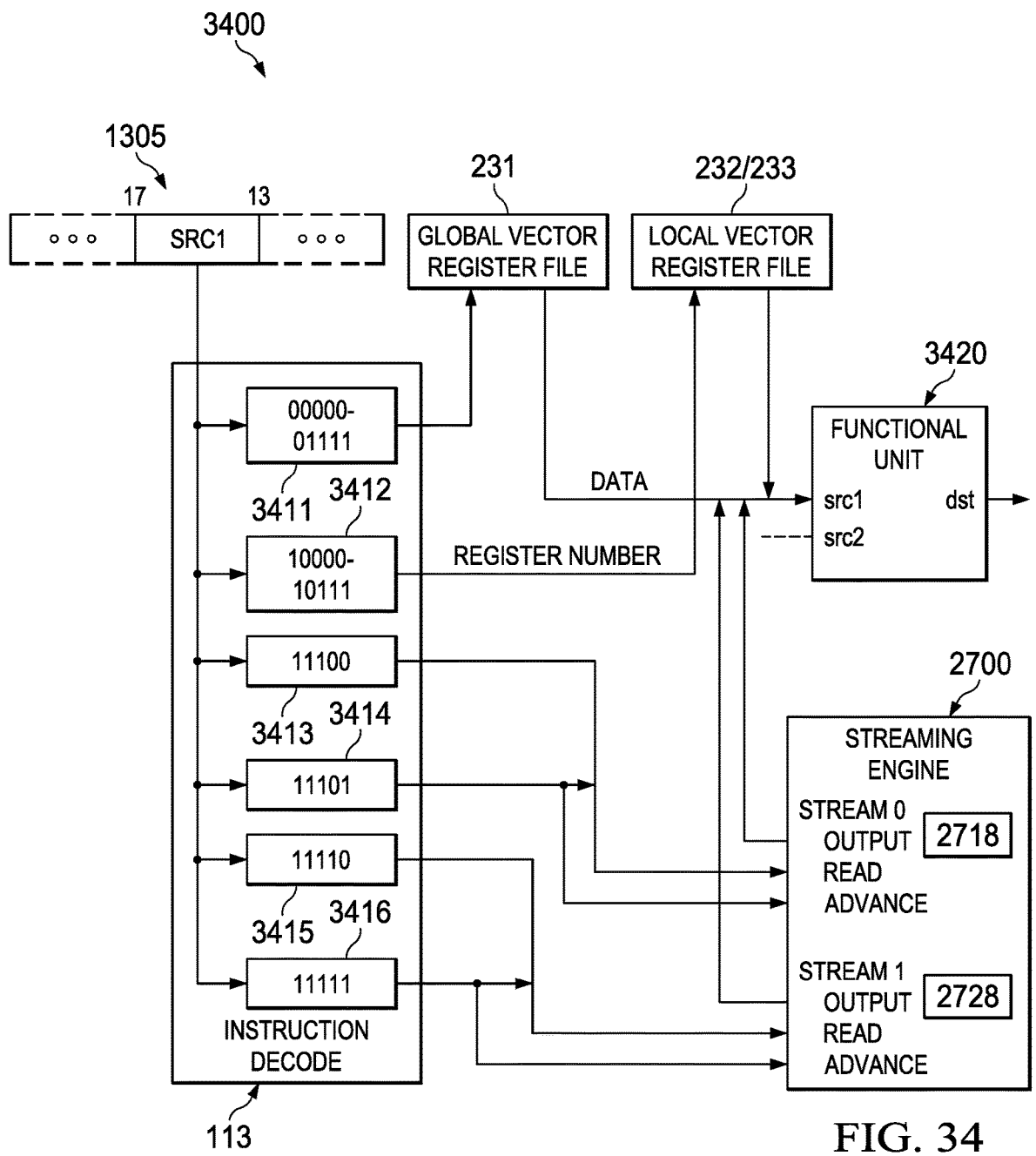
FIG. 34 illustrates a partial schematic diagram showing the streaming engine supply of data of this invention.

FIG. 34 is a partial schematic diagram 3400 illustrating the stream input operand coding described above. FIG. 34 illustrates decoding src1 field 1305 of one instruction of a corresponding src1 input of functional unit 3420. These same circuits are duplicated for src2/cst field 1304 and the src2 input of functional unit 3420. In addition, these circuits are duplicated for each instruction within an execute packet that can be dispatched simultaneously.

Instruction decoder 113 receives bits 13 to 17 comprising src1 field 1305 of an instruction. The opcode field opcode field (bits 4 to 12 for all instructions and additionally bits 28 to 31 for unconditional instructions) unambiguously specifies a corresponding functional unit 3420. In this embodiment functional unit 3420 could be L2 unit 241, S2 unit 242, M2 unit 243, N2 unit 244 or C unit 245. The relevant part of instruction decoder 113 illustrated in FIG. 34 decodes src1 bit field 1305. Sub-decoder 3411 determines whether src1 bit field 1305 is in the range from 00000 to 01111. If this is the case, sub-decoder 3411 supplies a corresponding register number to global vector register file 231. In this example this register field is the four least significant bits of src1 bit field 1305. Global vector register file 231 recalls data stored in the register corresponding to this register number and supplies this data to the src1 input of functional unit 3420. This decoding is generally known in the art.

Sub-decoder 3412 determines whether src1 bit field 1305 is in the range from 10000 to 10111. If this is the case, sub-decoder 3412 supplies a corresponding register number to the corresponding local vector register file. If the instruction is directed to L2 unit 241 or S2 unit 242, the corresponding local vector register file is local vector register field 232. If the instruction is directed to M2 unit 243, N2 unit 244 or C unit 245, the corresponding local vector register file is local vector register field 233. In this example this register field is the three least significant bits of src1 bit field 1305. Local vector register file 231 recalls data stored in the register corresponding to this register number and supplies this data to the src1 input of functional unit 3420. The corresponding local vector register file 232/233 recalls data stored in the register corresponding to this register number and supplies this data to the src1 input of functional unit 3420. This decoding is generally known in the art.

Sub-decoder 3413 determines whether src1 bit field 1305 is 11100. If this is the case, sub-decoder 3413 supplies a stream 0 read signal to streaming engine 2700. Streaming engine 2700 then supplies stream 0 data stored in holding register 2718 to the src1 input of functional unit 3420.

Sub-decoder 3414 determines whether src1 bit field 1305 is 11101. If this is the case, sub-decoder 3414 supplies a stream 0 read signal to streaming engine 2700. Streaming engine 2700 then supplies stream 0 data stored in holding register 2718 to the src1 input of functional unit 3420. Sub-decoder 3414 also supplies an advance signal to stream 0. As previously described, streaming engine 2700 advances to store the next sequential data elements of stream 0 in holding register 2718.

Sub-decoder 3415 determines whether src1 bit field 1305 is 11110. If this is the case, sub-decoder 3415 supplies a stream 1 read signal to streaming engine 2700. Streaming engine 2700 then supplies stream 1 data stored in holding register 2728 to the src1 input of functional unit 3420.

Sub-decoder 3416 determines whether src1 bit field 1305 is 11111. If this is the case, sub-decoder 3416 supplies a stream 1 read signal to streaming engine 2700. Streaming engine 2700 then supplies stream 1 data stored in holding register 2728 to the src1 input of functional unit 3420. Sub-decoder 3414 also supplies an advance signal to stream 1. As previously described, streaming engine 2700 advances to store the next sequential data elements of stream 1 in holding register 2728.

Similar circuits are used to select data supplied to scr2 input of functional unit 3402 in response to the bit coding of src2/cst field 1304. The src2 input of functional unit 3420 may be supplied with a constant input in a manner described above.

The exact number of instruction bits devoted to operand specification and the number of data registers and streams are design choices. Those skilled in the art would realize that other number selections that described in the application are feasible. In particular, the specification of a single global vector register file and omission of local vector register files is feasible. This invention employs a bit coding of an input operand selection field to designate a stream read and another bit coding to designate a stream read and advancing the stream.

What is claimed is:
1. A method comprising:
receiving a first virtual address that includes a first portion and a second portion;
receiving a second virtual address that includes a first portion and a second portion;
determining a first physical address for the first virtual address by comparing the first portion of the first virtual address to a set of entries of an address translation table;
determining a second physical address for the second virtual address by comparing the first portion of the second virtual address to the first portion of the first virtual address;
performing an access of a memory using the first physical address; and
performing an access of the memory using the second physical address, wherein:
the memory is a level two cache of a cache hierarchy;
the performing of the access of the memory using the first physical address accesses the level two cache without accessing an intervening level one cache of the cache hierarchy; and
the performing of the access of the memory using the second physical address accesses the level two cache without accessing the intervening level one cache of the cache hierarchy.

2. A device comprising:
an address translation unit configured to receive a first portion of a first address, a second portion of the first address, a first portion of a second address, and a second portion of the second address, wherein the address translation unit includes:
an address translation table memory configured to store a set of entries;
a first comparator circuit that includes:
a first input coupled to receive the first portion of the first address;
a second input coupled to the address translation table memory; and
an output to provide a first comparison signal based on a comparison between the first portion of the first address and the set of entries;
a selection circuit that includes:
a first input coupled to the output of the first comparator circuit;
a second input coupled to the address translation table memory; and
an output to provide an address portion based on the set of entries and on the first comparison signal;
a second comparator circuit that includes:
a first input coupled to receive the first portion of the first address;
a second input coupled to receive the first portion of the second address; and
an output to provide a second comparison signal based on a comparison between the first portion of the first address and the first portion of the second address;
a concatenation circuit that includes:
a first input coupled to the output of the selection circuit;
a second input coupled to receive the second portion of the first address;
a third input coupled to the output of the selection circuit and to the output of the second comparator circuit;
a fourth input coupled to receive the second portion of the second address;
a first output to provide a first translated address associated with the first address; and a second output to provide a second translated address associated with the second address.

3. The device of claim 2, wherein the concatenation circuit is configured to concatenate the address portion provided by the selection circuit with the second portion of the first address to determine the first translated address.

4. The device of claim 2, wherein the concatenation circuit is configured to determine, based on the second comparison signal, whether to concatenate the address portion provided by the selection circuit with the second portion of the second address to determine the second translated address.

5. The device of claim 2 further comprising an address generator coupled to the address translation unit and configured to provide the first address and the second address.

6. The device of claim 5, wherein the address generator is configured to provide the first address and the second address in response to a stream instruction.

7. The device of claim 2, wherein:
the first portion of the first address is a set of most significant bits of the first address;
the second portion of the first address is a set of least significant bits of the first address;
the first portion of the second address is a set of most significant bits of the second address; and
the second portion of the second address is a set of least significant bits of the second address.

8. The device of claim 2 further comprising a memory interface coupled to the concatenation circuit and configured to:
retrieve a first data element from a memory based on the first translated address; and
retrieve a second data element from the memory based on the second translated address.

9. The device of claim 8, wherein:
the memory is a level two cache of a memory hierarchy; and
the memory interface is configured to retrieve the first data element and the second data element from the level two cache via a data path that does not include a level one cache of the memory hierarchy.

10. The device of claim 2, wherein:
the first address and the second address are virtual addresses; and
the first translated address and the second translated address are physical addresses.

11. The device of claim 2 further comprising a processing core, wherein:
each entry of the set of entries includes a set of permissions; and
the first comparator circuit is configured to compare a privilege execution mode of the processing core to the sets of permissions of the set of entries.

12. The device of claim 11, wherein each set of permissions specifies whether a respective region of memory is readable.

13. The device of claim 11, wherein each set of permission specifies whether a respective address is valid.

14. The method of claim 1, wherein the determining of the first physical address includes:
determining a first portion of the first physical address by comparing the first portion of the first virtual address to the set of entries of the address translation table; and
appending the second portion of the first virtual address to the first portion of the first physical address as a second portion of the first physical address.

15. The method of claim 14, wherein the determining of the second physical address includes:
determining a first portion of the second physical address by comparing the first portion of the second virtual address to the first portion of the first virtual address; and
appending the second portion of the second virtual address to the first portion of the second physical address as a second portion of the second physical address.

16. The method of claim 1, wherein:
the first portion of the first virtual address is a set of most significant bits of the first virtual address;
the second portion of the first virtual address is a set of least significant bits of the first virtual address;
the first portion of the second virtual address is a set of most significant bits of the second virtual address; and
the second portion of the second virtual address is a set of least significant bits of the second virtual address.

17. The method of claim 1, wherein:
each entry of the set of entries of the address translation table includes a respective set of permissions; and
the comparing of the first portion of the first virtual address to the set of entries of the address translation table includes comparing the sets of permissions to a privilege execution mode of a processor associated with the first virtual address and the second virtual address.

18. The method of claim 1, wherein:
the determining of the second physical address includes, based on the first portion of the second virtual address not matching the first portion of the first virtual address, determining the second physical address for the second virtual address by comparing the first portion of the second virtual address to the set of entries of the address translation table; and
the method further comprises:
receiving a third virtual address that includes a first portion and a second portion; and
determining a third physical address for the third virtual address by comparing the first portion of the third virtual address to the first portion of the second virtual address.

19. The method of claim 1 further comprising generating the first virtual address and the second virtual address in response to a stream instruction.

* * * * *